(12) United States Patent
Shin et al.

(10) Patent No.: US 10,957,380 B2
(45) Date of Patent: Mar. 23, 2021

(54) MEMORY DEVICE SCRAMBLING ADDRESS

(71) Applicant: Samsung Electronics Co., Ltd., Suwon-si (KR)

(72) Inventors: Hyun-sung Shin, Seoul (KR); Dae-Jeong Kim, Seoul (KR); Ik-Joon Choi, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 62 days.

(21) Appl. No.: 16/369,034

(22) Filed: Mar. 29, 2019

(65) Prior Publication Data

US 2020/0027497 A1    Jan. 23, 2020

(51) Int. Cl.
   *G11C 11/40*     (2006.01)
   *G11C 11/408*    (2006.01)
   (Continued)

(52) U.S. Cl.
   CPC ........ *G11C 11/4087* (2013.01); *G06F 3/0604* (2013.01); *G06F 3/0659* (2013.01); *G06F 3/0673* (2013.01); *G11C 11/406* (2013.01); *G11C 11/4085* (2013.01); *G11C 11/4091* (2013.01); *G11C 17/16* (2013.01); *G11C 17/18* (2013.01)

(58) Field of Classification Search
   CPC ..... G11C 11/4087; G11C 17/16; G11C 17/18; G11C 11/4091; G11C 11/406; G11C 11/4085; G11C 7/02; G11C 8/10; G11C 16/3427; G11C 16/24; G11C 16/08; G11C 11/005; G11C 8/14; G11C 7/18; G06F 3/0673; G06F 3/0604; G06F 3/0659
   See application file for complete search history.

(56) References Cited

U.S. PATENT DOCUMENTS 4,896,301 A   1/1990   Ogawa
6,065,143 A   5/2000   Yamasaki et al.
(Continued)

FOREIGN PATENT DOCUMENTS

JP        2006040534 A    2/2006
KR     1020030022611 A    3/2003
(Continued)

*Primary Examiner* — Jay W. Radke
(74) *Attorney, Agent, or Firm* — Muir Patent Law, PLLC

(57) ABSTRACT

According to an exemplary embodiment, a memory device may include a memory cell array that includes memory cells connected to word lines arranged in sequential order depending on a sequential change of a row address, a row decoder that, for each row address input to the row decoder, scrambles a first bit of the row address and a second bit of the row address depending on a selection signal, thereby forming a scrambled row address, decodes the scrambled row address, and selects a word line from the word lines based on the scrambled row address, and an anti-fuse array that includes an anti-fuse in which a logical value of the selection signal is programmed. A first word line and a second word line of the word lines may be adjacent to each other, and a difference between a first value of the row address corresponding to the first word line and a second value of the row address corresponding to the second word line may be a value corresponding to the first bit.

20 Claims, 11 Drawing Sheets

(51) Int. Cl.
    *G11C 11/4091*     (2006.01)
    *G11C 11/406*     (2006.01)
    *G06F 3/06*     (2006.01)
    *G11C 17/18*     (2006.01)
    *G11C 17/16*     (2006.01)

(56) References Cited

U.S. PATENT DOCUMENTS

| | | |
|---|---|---|
| 7,353,401 B2 | 4/2008 | Liang |
| 7,493,467 B2 | 2/2009 | Gould |
| 9,400,890 B2 | 7/2016 | Bostley, III et al. |
| 2003/0048678 A1 | 3/2003 | Lee et al. |
| 2003/0214870 A1 | 11/2003 | Cho |
| 2004/0260934 A1 | 12/2004 | Proll et al. |
| 2013/0094320 A1 | 4/2013 | Yoo et al. |
| 2013/0268727 A1* | 10/2013 | Sohn ................... G06F 13/1668 711/105 |
| 2014/0013169 A1 | 1/2014 | Kobla et al. |
| 2014/0104921 A1 | 4/2014 | Yu et al. |
| 2016/0163377 A1 | 6/2016 | Oh et al. |
| 2016/0216916 A1 | 7/2016 | Haywood et al. |
| 2016/0328156 A1 | 11/2016 | Swarbrick et al. |
| 2017/0147509 A1 | 5/2017 | Nevers et al. |

FOREIGN PATENT DOCUMENTS

| | | |
|---|---|---|
| KR | 10-2003-0056185 A | 7/2003 |
| KR | 1020030089345 A | 11/2003 |
| KR | 10-2006-0059492 A | 6/2006 |
| KR | 1020140046854 A | 4/2014 |

\* cited by examiner

MEMORY DEVICE SCRAMBLING ADDRESS

CROSS-REFERENCE TO RELATED APPLICATIONS

This application claims priority under 35 U.S.C. § 119 to Korean Patent Application No. 10-2018-0085497 filed on Jul. 23, 2018, in the Korean Intellectual Property Office, the disclosure of which is incorporated by reference herein in its entirety.

BACKGROUND

The present disclosure relates to a memory device, and more particularly, relates to a memory device scrambling an address.

A memory device may include memory cells arranged at intersections of word lines and bit lines. As the capacity and the degree of integration of the memory device increase, a gap between word lines and a gap between bit lines may decrease. In the case where a memory cell is a dynamic random access memory (DRAM) cell, a threshold voltage of a transistor may be set to be high for preventing a leakage current of a capacitor. To turn on the transistor, a higher voltage than a power supply voltage may be applied to a word line. When a high voltage is frequently applied to word lines which are adjacent to each other, an error may occur in data stored in memory cells.

Since a host may randomly access a memory device, the host may frequently access memory cells which are adjacent to each other. Accordingly, there is a desire for a memory device that prevents or minimizes a pass gate effect (PGE), disturbance, coupling, etc. which may occur due to a frequent access to memory cells which are adjacent to each other.

SUMMARY

According to an exemplary embodiment, a memory device may include a memory cell array that includes memory cells connected to word lines arranged in sequential order depending on a sequential change of a row address, a row decoder that, for each row address input to the row decoder, scrambles a first bit of the row address and a second bit of the row address depending on a selection signal, thereby forming a scrambled row address, decodes the scrambled row address, and selects the a word line from the word lines based on the scrambled row address, and an anti-fuse array that includes an anti-fuse in which a logical value of the selection signal is programmed. A first word line and a second word line of the word lines may be adjacent to each other, and a difference between a first value of the row address corresponding to the first word line and a second value of the row address corresponding to the second word line may be a value corresponding to the first bit.

According to exemplary embodiments, a memory device includes a memory cell array including memory cells connected to word lines which are arranged in sequential order depending on a sequential change of a row address, a row decoder configured to, for each row address input to the row decoder, scramble a particular-positioned bit of the row address and another-positioned bit of the row address based on the state of a selection signal, thereby forming a scrambled row address, to decode the scrambled row address, and to select a word line from the word lines based on the scrambled row address, and an anti-fuse array including an anti-fuse in which a logical value of the selection signal is programmed. A word line corresponding to a first inputted row address is different from a word line corresponding to a scrambled row address that corresponds to the first inputted row address, a first word line and a second word line of the word lines are adjacent to each other, and a difference between a first value of the row address corresponding to the first word line and a second value of the row address corresponding to the second word line is a decimal value of 1.

According to an exemplary embodiment, a memory device may include a memory cell array that includes first memory cells connected to a first word line, second memory cells connected to a second word line adjacent to the first word line, and third memory cells connected to a third word line not adjacent to the first and second word lines, a command decoder that receives a first activate command for activating the first memory cells, receives a first deactivate command for deactivating the first memory cells, and receives a second activate command for activating the second memory cells, and a row decoder that activates the first word line corresponding to a first value of a row address received together with the first activate command, deactivates the first word line depending on the first deactivate command, and activates the third word line corresponding to a third, scrambled, value of the row address, instead of the second word line corresponding to a second value of the row address, when the second value of the row address is received together with the second activate command.

According to an exemplary embodiment, a memory device may include a memory cell array that includes memory cells connected to column selection lines which are arranged in sequential order depending on a sequential change of a column address, a column decoder that scrambles a first bit of the column address and a second bit of the column address depending on a selection signal and decodes the scrambled column address, and to select the column selection lines, and an anti-fuse array that includes an anti-fuse in which a logical value of the selection signal is programmed. A difference between a first value of the column address corresponding to a first column selection line of the column selection lines and a second value of the column address corresponding to a second column selection line of the column selection lines is a value corresponding to the first bit.

DETAILED DESCRIPTION

Figure 1:
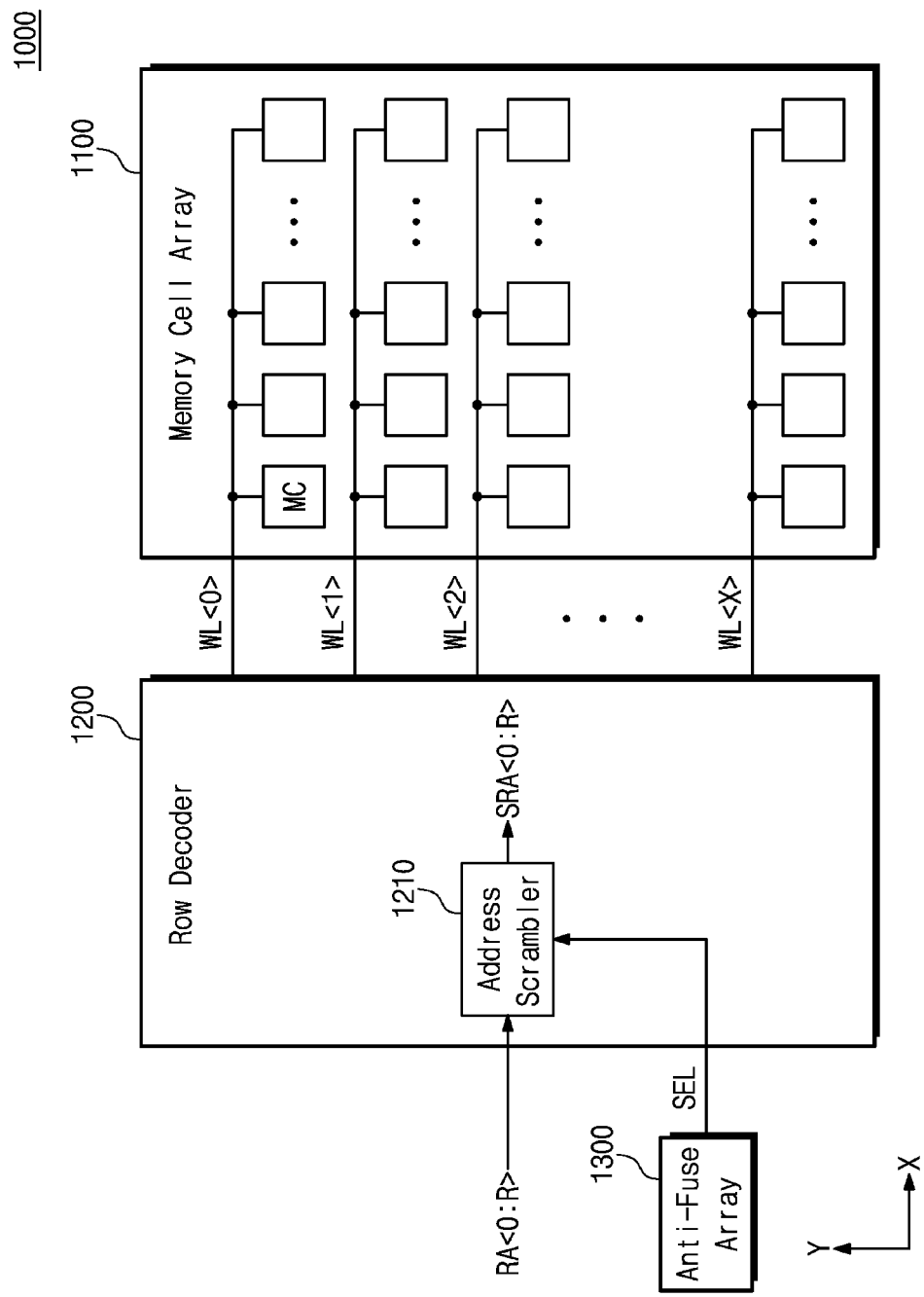
FIG. 1 is a block diagram illustrating a memory device according to an embodiment of the inventive concept.

FIG. 1 is a block diagram illustrating a memory device according to an embodiment of the inventive concept. A memory device 1000 may include a memory cell array 1100, a row decoder 1200, and an anti-fuse array 1300. As described herein, a memory device may be, for example, a semiconductor device, such as a semiconductor chip formed on a die from a wafer. A semiconductor device may also refer to a semiconductor package, which includes one or more semiconductor chips formed on a package substrate and covered by an encapsulant.

The memory cell array 1100 may include memory cells MC connected to word lines WL<0:X>. For example, a memory cell MC may be a dynamic random access memory (DRAM) cell, a static random access memory (SRAM) cell, a thyristor random access memory (TRAM) cell, a NAND flash memory cell, a NOR flash memory cell, a resistive random access memory (RRAM) cell, a ferroelectric random access memory (FRAM) cell, a phase change random access memory (PRAM) cell, a magnetic random access memory (MRAM) cell, etc. Below, it is assumed that the memory cell MC is a DRAM cell including one transistor connected to a word line and one capacitor connected to the transistor.

The memory cells MC of each of the word lines WL<0:X> may correspond to one page. When one word line of the word lines WL<0:X> is selected depending on a row address RA<0:R>, memory cells connected to the selected word line may be activated. A write operation or a read operation may be performed on the activated memory cells MC. After the write operation or the read operation is completed, the activated memory cells MC may be deactivated or decharged.

The row decoder 1200 may decode the row address RA<0:R> and may select the word lines WL<0:X>. A range of the row address RA<0:R>, the number of the word lines WL<0:X>, and the number of the memory cells MC may be determined based on a capacity of the memory device 1000, the number of data input/output signals, the number of banks, a page size, etc.

The row decoder 1200 may select a word line, which corresponds to a value (e.g., a decimal value) of the row address RA<0:R>, from among the word lines WL<0:X>. When the row address RA<0:R> is "00 . . . 00b", the row decoder 1200 may select the word line WL<0>. When the row address RA<0:R> is "00 . . . 01b", the row decoder 1200 may select the word line WL<1>. When the row address RA<0:R> is "00 . . . 10b", the row decoder 1200 may select the word line WL<2>. The row decoder 1200 may select the remaining word lines WL<3:X> in the above-described manner.

A threshold voltage of a transistor in the memory cell MC may be set to be high for decreasing a leakage current of a capacitor of the memory cell MC. A high voltage higher than a power supply voltage may be used to turn on the transistor of the memory cell MC. For example, the row decoder 1200 may select a word line corresponding to a value of the row address RA<0:R> by applying the high voltage higher than the power supply voltage to the word line corresponding to the value of the row address RA<0:R>. After a latency (e.g., tRAS) determined in advance, the row decoder 1200 may deactivate or decharge the selected word line by applying a ground voltage or a low voltage lower than the ground voltage to the selected word line.

In one embodiment, the word lines WL<0:X> may be arranged in sequential order depending on a sequential change of the row address RA<0:R>. "R" and X" are a natural number, and "X" is "$2^{R+1}-1$". Referring to FIG. 1, as a value of the row address RA<0:R> increases, a Y-coordinate value of the word lines WL<0:X> may decrease. Unlike illustration of FIG. 1, as a value of the row address RA<0:R> increases, a Y-coordinate value of the word lines WL<0:X> may increase. In any case, the word lines WL<0:X> may be arranged in order along the Y-axis. Here, the Y-axis may be perpendicular to the X-axis having a direction from the row decoder 1200 to the memory cell array 1100.

For example, a difference between a value of the row address RA<0:R>(=00 . . . 00b) corresponding to the word line WL<0> and a value of the row address RA<0:R> (=00 . . . 01b) corresponding to the word line WL<1> may be a decimal value (e.g., $2^0=1$) corresponding to the least significant bit (LSB) RA<0> of the row address RA<0:R>. A difference between a value of the row address RA<0:R> (=00 . . . 01b) corresponding to the word line WL<1> and a value of the row address RA<0:R>(=00 . . . 10b) corresponding to the word line WL<2> may also be the decimal value corresponding to the least significant bit RA<0> of the row address RA<0:R>. A difference between values of the row address RA<0:R>respectively corresponding to word lines, which are adjacent to each other, from among the word lines WL<0:X> may be the decimal value ($2°=1$) which the least significant bit RA<0> of the row address RA<0: R>indicates. A word line corresponding to a first logical value (e.g., a binary value of "0") of the least significant bit RA<0> of the row address RA<0:R> may be adjacent to a word line corresponding to a second logical value (e.g., a binary value of "1") of the least significant bit RA<0> of the row address RA<0:R>.

When word lines which are adjacent to each other are frequently selected, a pass gate effect (PGE), disturbance, coupling, etc. may occur in memory cells connected to the word lines which are adjacent to each other. An error may occur in data stored in the memory cells due to the above-described phenomenon. To avoid this situation, the memory device 1000 may scramble the row address RA<0:R> and may prevent the pass gate effect (PGE), disturbance, coupling, etc.

The row decoder 1200 may include an address scrambler 1210. The address scrambler 1210 may be a circuit configured to scramble a first bit and a second bit of the row address RA<0:R>depending on (or in response to) the selection signal SEL (e.g., based on a value or state of the selection signal) and may generate a scrambled row address SRA<0:R>. The first bit is the least significant bit RA<0> of the row address RA<0:R>, and the second bit may be an upper bit (any bit of RA<1:R>) of the least significant bit RA<0>in the row address RA<0:R>.

A bit of the scrambled row address SRA<0:R>which corresponds to a position of the first bit of the row address RA<0:R> may have a value of the second bit of the row address RA<0:R>. A bit of the scrambled row address SRA<0:R>which corresponds to a position of the second bit of the row address RA<0:R> may have a value of the first bit of the row address RA<0:R>. The row decoder 1200 may decode the scrambled row address SRA<0:R>instead of the row address RA<0:R> and may select at least one of the word lines WL<0:X>. In this manner, in some embodiments, the scrambled row address SRA<0:R>has two bits that are swapped with each other in relation to the row address RA<0:R>.

For example, in one embodiment if it is assumed that the first bit to be scrambled or swapped is the least significant bit RA<0> of the row address RA<0:R>, and the second bit to be scrambled or swapped is a fourth bit RA<3> of the row address RA<0:R>, then in the case where a row address RA<0:R>(=00 . . . 0000b) corresponding to the word line WL<0> and a row address RA<0:R>(=00 . . . 0001b) corresponding to the word line WL<1> are sequentially input to the row decoder 1200, the address scrambler 1210 may generate a scrambled row address SRA<0:R>(=00 . . . 0000b) and a scrambled row address SRA<0:R>(=00 . . . 1000b). When the first bit and the second bit to be scrambled or swapped are identical to each other, the row address RA<0:R> and the scrambled row address SRA<0:R> may be identical to each other even though the scramble operation is performed.

The row decoder 1200 may select the word line WL<0>corresponding to the scrambled row address SRA<0:R>(=00 . . . 0000b), and may then select the word line WL<8>corresponding to the scrambled row address SRA<0:R>(=00 . . . 1000b) instead of the word line WL<1>corresponding to the row address RA<0:R> (=00 . . . 0001b). Even though the row decoder 1200 receives row addresses corresponding to word lines which are adjacent to each other, the row decoder 1200 may scramble the row addresses and may select word lines which are not adjacent to each other.

The anti-fuse array 1300 may include an array of anti-fuses (not illustrated) arranged along the X-axis and the Y-axis. The anti-fuse array 1300 may include an anti-fuse to which a logical value of the selection signal SEL is programmed. The anti-fuse may be ruptured by an electrical signal. For example, an anti-fuse may be changed from a high resistance state to a low resistance state by the electrical signal. The anti-fuse may be a nonvolatile and one-time programmable (OTP) memory.

Information about the memory device 1000 may be programmed to the anti-fuse array 1300. For example, in the case where an anti-fuse corresponding to the selection signal SEL is programmed, a logical value of the selection signal SEL may be changed. Of course, as well as the logical value of the selection signal SEL, any other information about the memory device 1000 may be further programmed to the anti-fuse array 1300. With regard to the memory cell array 1100, a fail row address, a fail column address, trimming information of an internal voltage, etc. may be further programmed to the anti-fuse array 1300. A logical value of the selection signal SEL may be provided to the address scrambler 1210. In one embodiment, in the case where the anti-fuse corresponding to the selection signal SEL is not programmed (e.g., is in a first state), the address scrambler 1210 does not scramble the row address RA<0:R>. In this case, the row address RA<0:R> and the scrambled row address SRA<0:R> are identical to each other. In the case where the anti-fuse corresponding to the selection signal SEL is programmed (e.g., is in a second state), the address scrambler 1210 scrambles the row address RA<0:R> and may generate the scrambled row address SRA<0:R>which may be identical to or different from the row address RA<0:R>.

In one embodiment, during a wafer test step, a package test step, and a module test step which are performed by test equipment (e.g., automatic test equipment (ATE)), the anti-fuse corresponding to the selection signal SEL is not programmed. The test equipment may not program the anti-fuse corresponding to the selection signal SEL such that the memory device 1000 does not scramble an address, may select word lines which are adjacent to each other in the memory device 1000 depending on a test program (or a test pattern) used to detect and screen a fault present in the memory device 1000, and may access memory cells which are adjacent to each other. After performing the wafer test step, the package test step, and the module test step, the test equipment may program the anti-fuse corresponding to the selection signal SEL. For example, after the memory device 1000 is packaged and is mounted on a module and a module test is completed, a logical value of the selection signal SEL may be programmed to the anti-fuse. The decision of whether or not to program the anti-fuse that corresponds to the selection signal SEL may depend on the test results. For example, test results that indicate one or more errors for adjacent word lines may result in programming of the anti-fuse to change the logic value of the selection signal SEL, whereas test results that indicate no errors, or errors below a certain amount may result in not programming the anti-fuse.

In some of the description herein, different bits of an address may be referred to as position bits. For example, a first-position bit may refer to a least significant bit, a second-position bit may refer to a next least significant bit, etc. Therefore, in one example, for an address having 16 bits, the sixteenth-position bit would refer to the most significant bit. Different sets of bits within an address may be referred to as lower-positioned bits and higher-positioned (or upper-positioned) bits. Therefore in some embodiments, a particular-positioned bit may be scrambled, or swapped, with another-positioned bit (e.g., a first-positioned bit may be swapped with a fourth-positioned bit so that the value of the first-positioned bit in the original address becomes the value of the fourth-positioned bit in the scrambled address, and the value of the fourth-positioned bit in the original address becomes the value of the first-positioned bit in the scrambled address. As a result, a word line corresponding to a first inputted row address may be different from a word line corresponding to a scrambled row address that corresponds to the first inputted row address.

Figure 2:
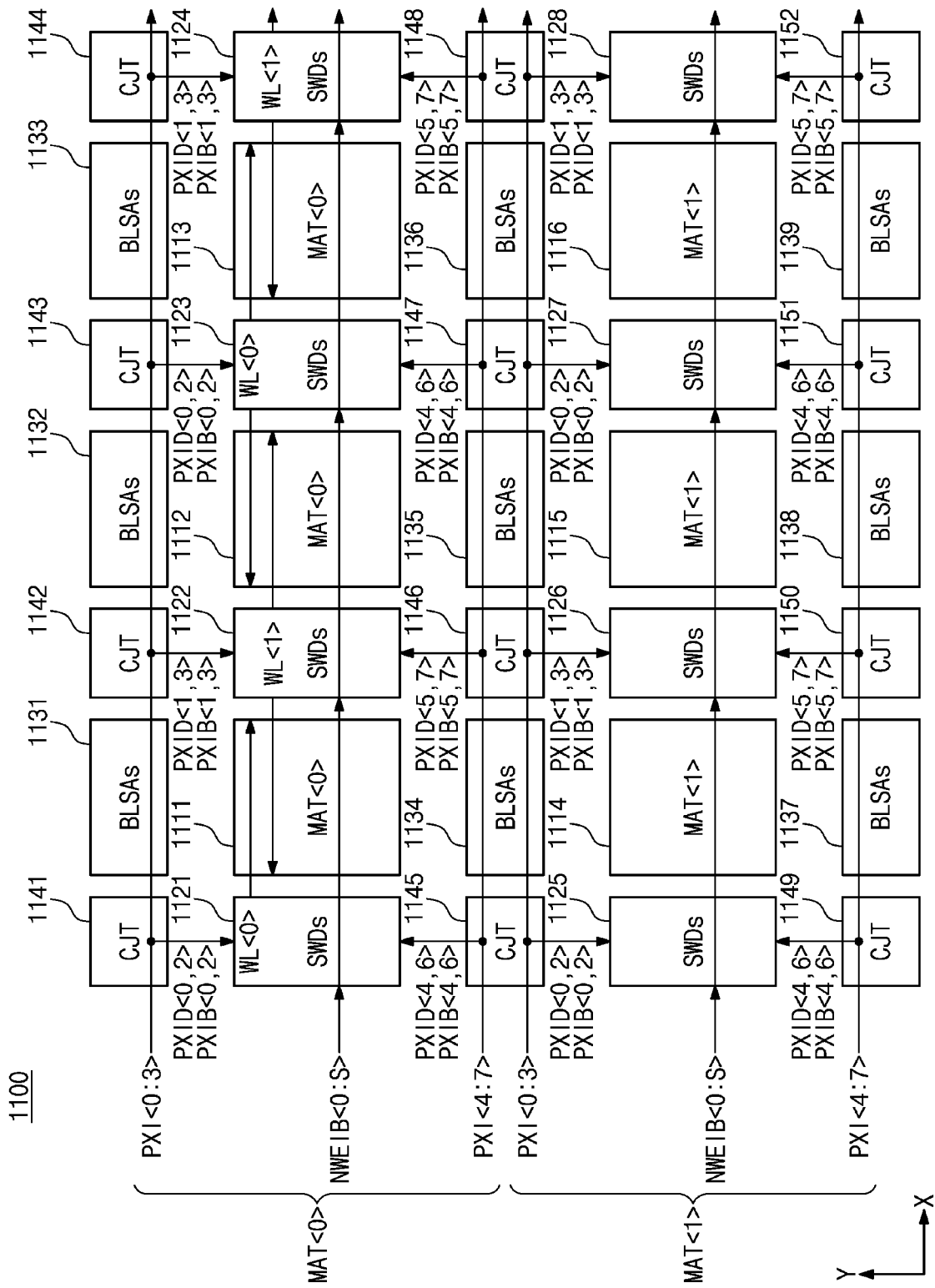
FIG. 2 is a block diagram illustrating a memory cell array of FIG. 1, according to some embodiments.

FIG. 2 is a block diagram illustrating a memory cell array of FIG. 1. FIG. 2 will be described with reference to FIG. 1. The memory cell array 1100 may include sub memory cell arrays 1111 to 1116, sub word line drivers 1121 to 1128, bit line sense amplifiers 1131 to 1139, and conjunctions 1141 to 1152.

Each of the sub memory cell arrays 1111 to 1116 may include memory cells connected to word lines and bit lines. The memory cells of the memory cell array 1100 may be divided into sub memory cell arrays. The number of sub memory cell arrays arranged along the X-axis may be determined, for example, based on a capacity of one bank, the number of data input/output signals, a page size, etc.

The sub word line drivers 1121 to 1128 may be interposed between the sub memory cell arrays 1111 to 1116 along the X-axis. The sub word line drivers 1121 and 1122 may be positioned on a left side and a right side of the sub memory cell array 1111 along the X-axis. The remaining sub word line drivers 1123 to 1128 may be arranged in the above-described manner.

The respective sub word line drivers 1121 to 1128 may receive first decoding signals PXI<0:7> and second decoding signals NWEIB<0:S> from the row decoder 1200, and may select and drive word lines arranged in the respective sub memory cell arrays 1111 to 1116. The first and second decoding signals PXI<0:7> and NWEIB<0:S> may be a result of decoding the row address RA<0:R> at the row decoder 1200. For example, the row decoder 1200 may decode a lower row address RA<0:2> and may generate the first decoding signals PXI<0:7>. The row decoder 1200 may decode an upper row address RA<3:R> and may generate the second decoding signals NWEIB<0:S>. Here, the number of bits of the lower row address RA<0:2>, the number of the first decoding signals PXI<0:7>, the number of bits of the upper row address RA<3:R>, and the number of bits of the second decoding signals NWEIB<0:S> are only an example.

The sub word line drivers 1121 and 1125 may apply a high voltage or a low voltage to word lines of the sub memory cell arrays 1111 and 1114 in the X-axis direction. Each of the remaining sub word line drivers 1122 to 1124 and 1126 to 1128 may select word lines of two sub memory cell arrays, while the sub word line drivers 1121 and 1125 may select word lines of one sub memory cell array. The sub word line drivers 1121 and 1125 may be the closest to the row decoder 1200 with respect to the X-axis. Sub word line drivers (not illustrated) which are the most distant from the row decoder 1200 with respect to the X-axis may select word lines of one sub memory cell array. The sub word line driver 1122 may apply a high voltage or a low voltage to word lines of the sub memory cell array 1112 in the X-axis direction (e.g., in a first direction along the X-axis), and may apply a high voltage or a low voltage to word lines of the sub memory cell array 1111 in a direction opposite to the X-axis direction (e.g., in a second direction along the X-axis, opposite the first direction). The sub word line driver 1122 may select word lines of adjacent sub memory cell arrays 1111 and 1112. Operations of the remaining sub word line drivers 1123, 1124, and 1126 to 1128 may be similar to the operation of the sub word line driver 1122.

As memory cells are divided into the sub memory cell arrays 1111 to 1113, the word line WL<0> illustrated in FIG. 1 may be physically divided into word lines WL<0> of the sub memory cell arrays 1111 to 1113. The physically divided word lines WL<0> may have the same Y-coordinate value, and may logically correspond to the same row address RA<0:R> (=00 . . . 00b). When the row decoder 1200 receives the row address RA<0:R> (=00 . . . 00b) corresponding to the word line WL<0>, the sub word line drivers 1121 may select the word line WL<0> of the sub memory cell array 1111, and the sub word line driver 1123 may select the word lines WL<0> of the sub memory cell arrays 1112 and 1113. According to the above scheme, since word lines are simultaneously driven by the sub word line drivers 1121 to 1128, a time taken to activate and deactivate one word line illustrated in FIG. 1 (e.g., a time taken for a word line voltage to transition from the low voltage to the high voltage or a time taken for a word line voltage to transition from the high voltage to the low voltage) may decrease.

All the sub word line drivers 1121 to 1124 arranged along the X-axis together with mats MAT<0> may receive the second decoding signals NWEIB<0:S> of the mats MAT<0>. The sub word line drivers 1121 and 1123 may receive the first decoding signals PXI<0>, PXI<2>, PXI<4>, and PXI<6> of the mats MAT<0>. The sub word line drivers 1122 and 1124 may receive the first decoding signals PXI<1>, PXI<3>, PXI<5>, and PXI<7> of the mats MAT<0>. The sub word line drivers 1121 and 1123 may select even-numbered word lines WL<i>(i=0, 2, 4, 6, . . . ) of the mats MAT<0>, and the sub word line drivers 1122 and 1124 may select odd-numbered word lines WL<j>(j=1, 3, 5, 7, . . . ) of the mats MAT<0>.

Unlike illustration of FIG. 2, the sub word line drivers 1121 and 1123 may receive the first decoding signals PXI<1>, PXI<3>, PXI<5>, and PXI<7> of the mats MAT<0>, and the sub word line drivers 1122 and 1124 may receive the first decoding signals PXI<0>, PXI<2>, PXI<4>, and PXI<6> of the mats MAT<0>. In this case, the sub word line drivers 1121 and 1123 may select the odd-numbered word lines WL<j>(j=1, 3, 5, 7, . . . ) of the mats MAT<0>, and the sub word line drivers 1122 and 1124 may select even-numbered word lines WL<i>(i=0, 2, 4, 6, . . . ) of the mats MAT<0>.

All the sub word line drivers 1125 to 1128 arranged along the X-axis together with mats MAT<1> may receive the second decoding signals NWEIB<0:S> of the mats MAT<1>. Also, the sub word line drivers 1125 to 1128 may receive the first decoding signals PXI<0:7> of the mats MAT<1>. Operations of the sub word line drivers 1125 to 1128 may be similar to the operations of the sub word line drivers 1121 to 1124.

The bit line sense amplifiers 1131 to 1139 may be interposed between the sub memory cell arrays 1111 to 1116 along the Y-axis. The bit line sense amplifier 1131 may be positioned on an upper side (or a right side) of the sub memory cell array 1111 along the Y-axis (e.g., at a first side of the sub memory cell array 111 along the Y-axis), and the bit line sense amplifier 1134 may be positioned on a lower side (or a left side) of the sub memory cell array 1111 along the Y-axis (e.g., at a second side of the sub memory cell array 111 along the Y-axis opposite the first side). The remaining bit line sense amplifiers 1132 to 1139 may also be arranged in the above-described manner. The number of the bit line sense amplifiers 1131 to 1139 is not limited to the number shown in FIG. 2. The memory cell array 1100 may include bit line sense amplifiers positioned on opposite sides of each of the sub memory cell arrays with respect to the Y-axis. Bit line sense amplifiers 1131 to 1136 positioned on opposite sides of the mats MAT<0> along the Y-axis may be used to sense data of selected memory cells of adjacent mats. Bit line sense amplifiers 1134 to 1139 positioned on opposite sides of the mats MAT<1> along the Y-axis may be used to sense data of selected memory cells of adjacent mats. The bit line sense amplifiers 1134 to 1136 may be used to sense data stored in the mats MAT<0> or MAT<1>.

Memory cells of the memory cell array 1100 may be divided into the mats MAT<0> and MAT<1> with respect to regions in which the bit line sense amplifiers 1131 to 1139 are arranged. An example is illustrated in FIG. 2 as two mats MAT<0> and MAT<1> are arranged along the Y-axis, but the number of mats is not limited thereto. As described herein, a mat refers to a group of memory cell arrays, or a group of sub memory cell arrays (e.g., in FIG. 2, a group of sub memory cell arrays arranged along the X-axis).

A capacitance of a bit line may be determined depending on the number of word lines arranged along the Y-axis in one mat. As the number of word lines in one mat decreases, a capacitance of a bit line may decrease, and thus, the bit line sense amplifiers 1131 to 1139 may sense data of memory cells more easily. In contrast, as the number of word lines in one mat decrease, the number of mats arranged along the Y-axis and the number of bit line sense amplifiers interposed between mats arranged along the Y-axis may increase. Accordingly, the area of the memory device 1000 may increase. The number of mats to be arranged along the Y-axis may be determined based on a range of the row address RA<0:R>, a capacity of one bank, the number of data input/output signals, a page size, a capacitor of a memory cell, a capacitance of a bit line, the area of the memory device 1000, etc.

Circuits which provide the first decoding signals PXI<0: 7>to the sub word line drivers 1121 to 1128 may be positioned at the respective conjunctions 1141 to 1152 of the mats MAT<0> and MAT<1>. The circuits positioned at the conjunction 1141 may receive and amplify the first decoding signals PXI<0> and PXI<2> from the row decoder 1200. The first decoding signals PXID<0> and PXID<2> and PXIB<0> and PXIB<2> may be signals obtained by amplifying the first decoding signals PXI<0> and PXI<2> at the circuits positioned at the conjunction 1141. The first decoding signals PXIB<0> and PXIB<2> may be inversion signals of the first decoding signals PXI<0> and PXI<2>. Operations of the circuits positioned at the remaining conjunctions 1142 to 1152 may be similar to the operation of the circuits positioned at the conjunction 1141.

The circuits positioned at the conjunction 1141 may provide the first decoding signals PXID<0> and PXID<2> and PXIB<0> and PXIB<2> of the mats MAT<0>to the sub word line drivers 1121 in a direction opposite to the Y-axis direction (e.g., in a first direction along the Y-axis). The circuits positioned at the conjunction 1145 may provide the first decoding signals PXID<4> and PXID<6> and PXIB<4> and PXIB<6> of the mats MAT<0>to the sub word line drivers 1121 in the Y-axis direction (e.g., in a second direction along the Y-axis, opposite the first direction). The circuits positioned at the conjunction 1142 may provide the first decoding signals PXID<1> and PXID<3> and PXIB<1> and PXIB<3> of the mats MAT<0>to the sub word line drivers 1122 in the opposite direction to the Y-axis direction (e.g., in the first direction along the Y-axis). The circuits positioned at the conjunction 1146 may provide the first decoding signals PXID<5> and PXID<7> and PXIB<5> and PXIB<7> of the mats MAT<0>to the sub word line drivers 1122 in the Y-axis direction (e.g., in the second direction along the Y-axis, opposite the first direction). Terms such as "first," "second," etc. may be used herein as a naming convention to differentiate two items, directions, or other values from each other, and do not necessarily convey an order unless the context indicates otherwise. Therefore, an item, direction, or value described as "first" or "second" in the claims or in one part of the specification does not necessarily refer to a particular previously-mentioned "first" or "second" item, direction, or value.

The circuits positioned at the conjunction 1145 may further provide the first decoding signals PXID<0> and PXID<2> and PXIB<0> and PXIB<2> of the mats MAT<1>to the sub word line drivers 1125 in the opposite direction to the Y-axis direction. The circuits positioned at the conjunction 1146 may further provide the first decoding signals PXID<1> and PXID<3> and PXIB<1> and PXIB<3> of the mats MAT<1>to the sub word line drivers 1126 in the opposite direction to the Y-axis direction. Operations of the circuits positioned at the remaining conjunctions 1143, 1144, and 1147 to 1152 may be similar to the operation of the circuits positioned at the conjunctions 1141, 1142, 1145, and 1146. The first decoding signals PXI<0:7>which the circuits positioned at the conjunctions 1141 to 1152 receive from the row decoder 1200 and the first decoding signals PXID<0:7> and PXIB<0:7>which the circuits provide are not limited to illustration of FIG. 2. Circuits to provide power supply voltages to the bit line sense amplifiers 1131 to 1139, circuits to precharge the bit line sense amplifiers 1131 to 1139, etc. may be further provided in the respective conjunctions 1141 to 1152.

Figure 3:
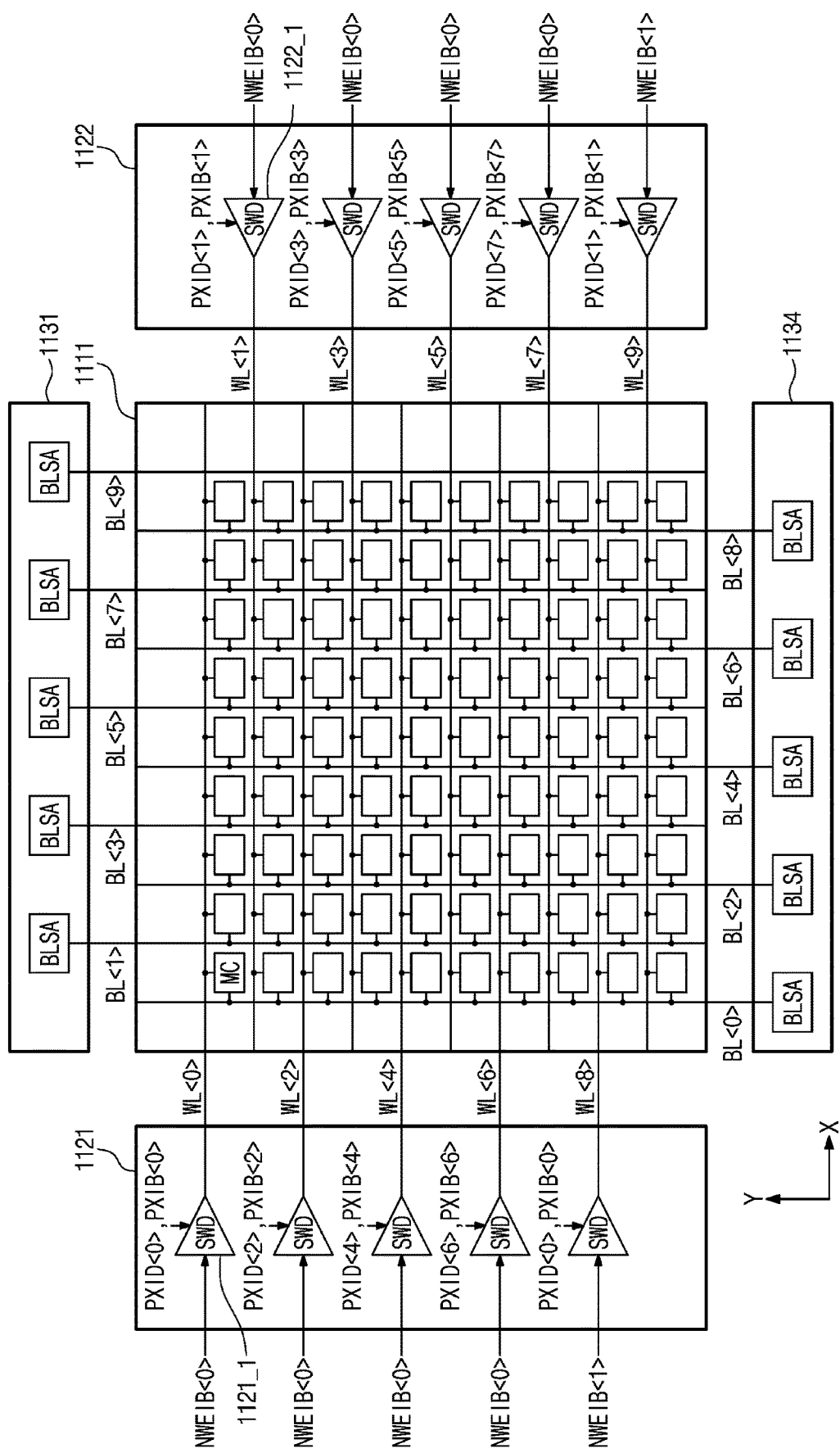
FIG. 3 is a block diagram illustrating a memory cell array of FIG. 2 in detail.

FIG. 3 is a block diagram illustrating a memory cell array of FIG. 2 in detail. Only the sub memory cell array 1111, the sub word line drivers 1121 and 1122, and the bit line sense amplifiers 1131 and 1134 are illustrated in FIG. 3 as an example.

As described above, the sub word line drivers 1121 and 1122 may select word lines of the sub memory cell array 1111. A sub word line driver 1121_1 which receives the first decoding signals PXID<0> and PXIB<0> and the second decoding signal NWEIB<0> may select the word line WL<0>. A sub word line driver 1122_1 which receives the first decoding signals PXID<1> and PXIB<1> and the second decoding signal NWEIB<0> may select the word line WL<1>. Operations of the remaining sub word line drivers may be identical to the above-described operations. The sub word line drivers 1121 may apply a high voltage or a low voltage to even-numbered word lines WL<0>, WL<2>, WL<4>, WL<6>, and WL<8>in the X-axis direction (e.g., in a first direction along the X-axis), and the sub word line driver 1122 may apply the high voltage or the low voltage to odd-numbered word lines WL<1>, WL<3>, WL<5>, WL<7>, and WL<9>in the opposite direction to the X-axis direction (e.g., in a second direction opposite the first direction along the X-axis). The sub word line drivers 1121 and 1122 may receive and share the same second decoding signal NWEIB<0>.

Ten word lines WL<0:9> and two second decoding signals NWEIB<0:1> are only illustrated in FIG. 3, but the number of word lines and the number of second decoding signals are not limited to illustration of FIG. 3. The number of the second decoding signals NWEIB<0:S>may be "(S+1)", and the number of word lines may be "(S+1)×8". Here, "8" is the number of the first decoding signals PXI<0:7> and is an exemplary value. The number of the sub word line drivers 1121 and 1122 may be identical to the number of word lines.

Bit lines BL<0:9> of the sub memory cell array 1111 may be arranged along the X-axis. The bit line sense amplifiers 1131 may be respectively connected to odd-numbered bit lines BL<1>, BL<3>, BL<5>, BL<7>, and BL<9>. The bit line sense amplifiers 1134 may be respectively connected to even-numbered bit lines BL<0>, BL<2>, BL<4>, BL<6>, and BL<8>. A bit line sense amplifier connected to the bit line BL<0> may sense data of a memory cell connected to a selected word line and the bit line BL<0>. The bit line sense amplifier connected to the bit line BL<0> may amplify a difference between a voltage of a bit line bar (not illustrated) in the sub memory cell array 1114 of FIG. 2 and a voltage of the bit line BL<0>. Operations of the remaining bit line sense amplifiers 1131 and 1134 may be identical to the above-described operation.

The number of the bit line sense amplifiers 1131 and 1134 is not limited to illustration in FIG. 3. The number of the bit line sense amplifiers 1131 and 1134 may be identical to the number of memory cells arranged in the sub memory cell array 1111 and connected to one word line (i.e., to the number of bit lines arranged along the X-axis in one mat). The number of bit lines in one mat may be determined based on a range of a column address, a capacity of one bank, the number of data input/output signals, a page size, the area of the memory device 1000, etc.

Figure 4:
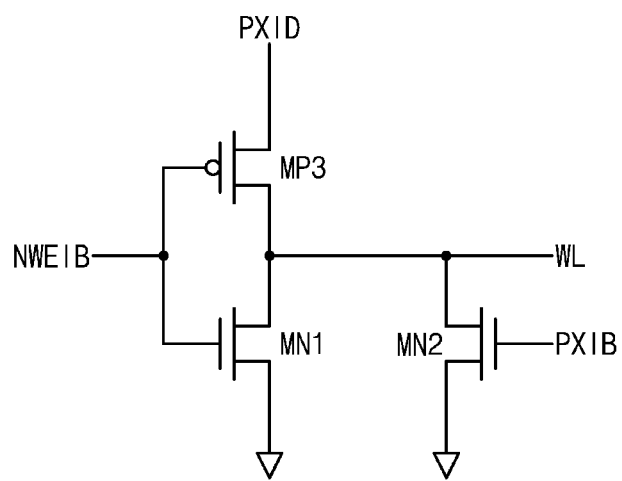
FIG. 4 is a block diagram illustrating a sub word line driver of FIG. 3, according to some embodiments.

FIG. 4 is a block diagram illustrating a sub word line driver of FIG. 3. The sub word line driver 1121_1 may include a first transistor MN1, a second transistor MN2, and a third transistor MP3. The remaining sub word line drivers illustrated in FIGS. 2 and 3 may be implemented to be identical to the sub word line driver 1121_1 of FIG. 4.

The first transistor MN1 may connect a word line WL and a ground voltage GND or may connect a word line WL and a voltage VBB2 lower than the ground voltage GND depending on a second decoding signal NWEIB as an NMOS transistor. The first transistor MN1 may drive the word lines WL to a low voltage depending on the second decoding signal NWEIB. The second transistor MN2 may connect the word line WL and the ground voltage GND or may connect the word line WL and the voltage VBB2 depending on the first decoding signal PXIB as an NMOS transistor. The second transistor MN2 may drive the word line WL to a low voltage depending on a first decoding signal PXIB. The third transistor MP3 may connect the word lines WL and a first decoding signal PXID depending on the second decoding signal NWEIB as a PMOS transistor. The third transistor MP3 may drive the word lines WL to a high voltage (e.g., a voltage VPP higher than a power supply voltage VDD) depending on the second decoding signal NWEIB.

The first decoding signals PXID and PXIB of FIG. 4 are a pair of signals among the first decoding signals PXID<0:7> and PXIB<0:7>, and the second decoding signal NWEIB is one of the second decoding signals NWEIB<0:S> of FIG. 2. The sub word line driver 1121_1 may receive the first driving signal PXID through a power terminal and may receive the second decoding signal NWEIB through an input terminal.

Figure 5:
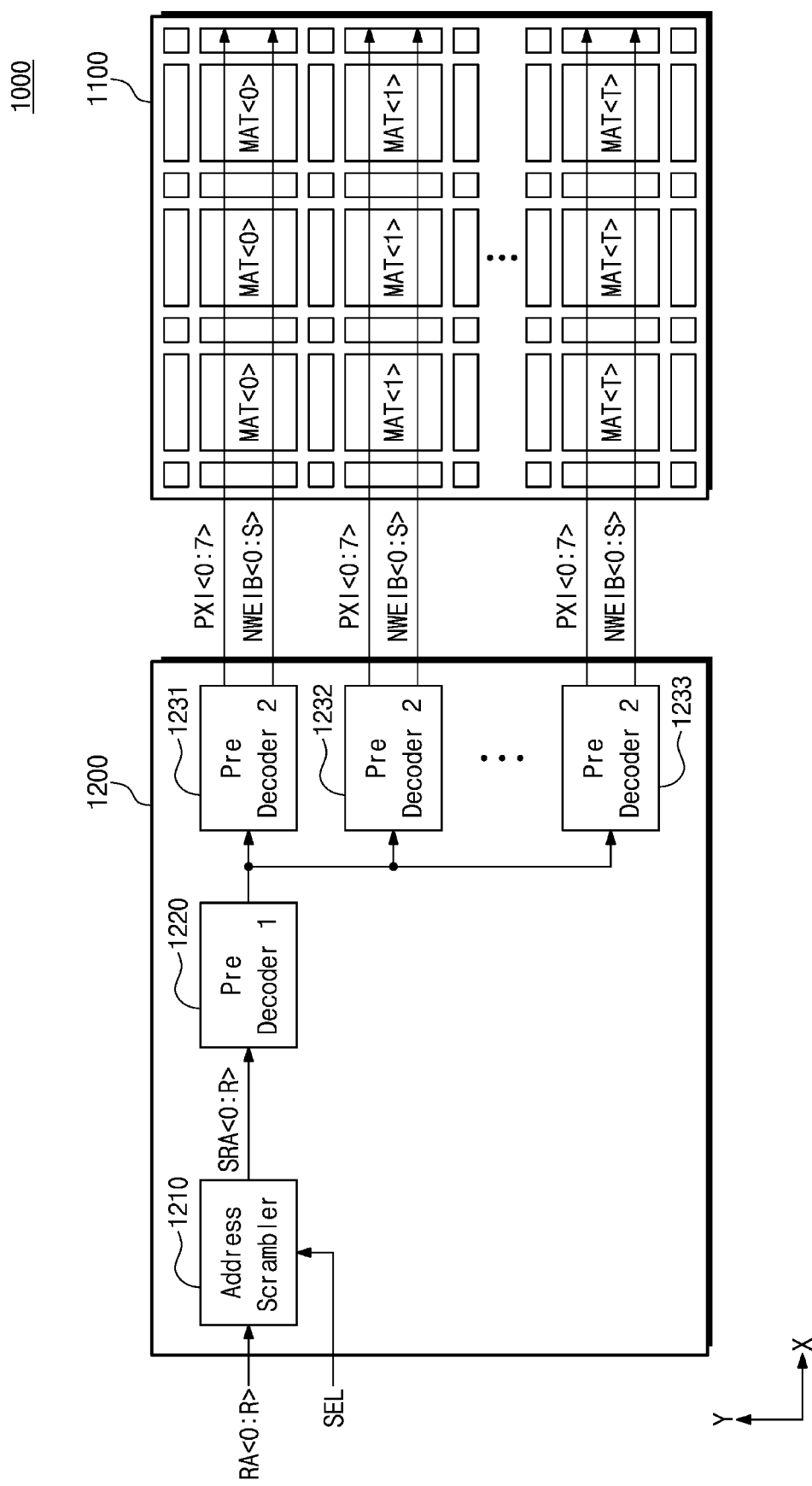
FIG. 5 is a block diagram illustrating a row decoder of a memory device of FIG. 1, according to some embodiments.

FIG. 5 is a block diagram illustrating a row decoder of a memory device of FIG. 1. FIG. 5 will be described with reference to FIGS. 1 to 4. The first decoding signals PXI<0:7>are illustrated in FIG. 5 as being arranged above mats, but the first decoding signals PXI<0:7> may be arranged as illustrated in FIG. 3. The row decoder 1200 may further include a first pre-decoder 1220 and second pre-decoders 1231 to 1233 in addition to the address scrambler 1210. As described above, the address scrambler 1210 may scramble the row address RA<0:R> and may generate the scrambled row address SRA<0:R>.

The first pre-decoder 1220 may decode the scrambled row address SRA<0:R>. The first pre-decoder 1220 may provide a decoding result of the scrambled row address SRA<0:R>to the second pre-decoders 1231 to 1233. The first pre-decoder 1220 may decode all bits of the scrambled row address SRA<0:R> and may select a word line. However, as well as a word line corresponding to the scrambled row address SRA<0:R>, the first pre-decoder 1220 may further select one, which is provided to an input terminal of a sub word line driver driving the word line, from among the second decoding signals NWEIB<0:S> and mats in which the word line is included.

In detail, the first pre-decoder 1220 may decode not all bits of the scrambled row address SRA<0:R>but only upper bits of the scrambled row address SRA<0:R> and may select one of the second pre-decoders 1231 to 1233. The first pre-decoder 1220 may select a mat where the word line corresponding to the scrambled row address SRA<0:R> is placed. For example, the first pre-decoder 1220 may decode a bit SRA<3> of the scrambled row address SRA<0:R>and upper bits of the bit SRA<3> and may select one of the second decoding signals NWEIB<0:S>. The first pre-decoder 1220 may decode a least significant bit SRA<0> of the scrambled row address SRA<0:R> and upper bits SRA<1:2> of a lower set of bits that include the least significant bit SRA<0>, and may select one of the first decoding signals PXI<0:7>. Here, the number of the first decoding signals PXI<0:7> and the number of bits SRA<0:2>used to decode or select the first decoding signals PXI<0:7> are an example.

Each of the second pre-decoders 1231 to 1233 may generate the first decoding signals PXI<0:7> and the second decoding signals NWEIB<0:S>based on a decoding result of the scrambled row address SRA<0:R>. The second pre-decoder 1231 may be positioned within the row decoder 1200 along the X-axis together with the mat MAT<0> of the memory cell array 1100 and may provide the first decoding signals PXI<0:7> and the second decoding signals NWEIB<0:S>to the mat MAT<0>. Operations and placement of the remaining pre-decoders 1232 and 1233 may be identical to the operation and placement of the second pre-decoder 1231. The number of the second pre-decoders 1231 to 1233 may be identical to the number of mats arranged along the Y-axis within the memory cell array 1100. In FIG. 5, "T" is a natural number which is smaller by 1 than the number of mats arranged along the Y-axis within the memory cell array 1100.

Figure 6:
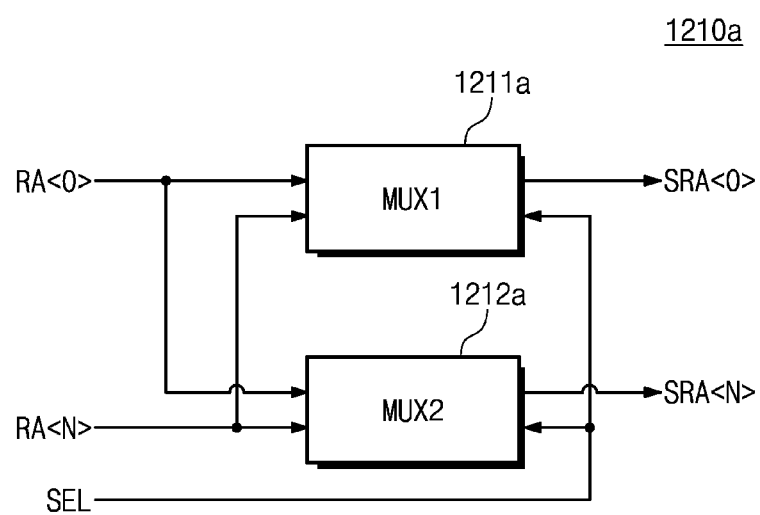
FIG. 6 is a block diagram illustrating one embodiment of an address scrambler of FIG. 5.

FIG. 6 is a block diagram illustrating one embodiment of an address scrambler of FIG. 5. FIG. 6 will be described with reference to FIGS. 1 to 5. An address scrambler 1210a may include a first multiplexer 1211a and a second multiplexer 1212a. The first multiplexer 1211a may output one of a first bit RA<0> and a second bit RA<N> of the row address RA<0:R>depending on the selection signal SEL. The second multiplexer 1212a may output one of the second bit RA<N> and the first bit RA<0> of the row address RA<0:R>depending on the selection signal SEL. In the case where the anti-fuse corresponding to the selection signal SEL is programmed, the first multiplexer 1211a may output the second bit RA<N>instead of the first bit RA<0>, and the second multiplexer 1212a may output the first bit RA<0>instead of the second bit RA<N>. The scrambled row address SRA<0:R> may include bits SRA<0> and SRA<N>output from the first and second multiplexers 1211a and 1212a, respectively. Thus, the bit SRA<0> and SRA<N> may be swapped in the scrambled row address SRA<0:R>compared to the row address RA<0:R>.

The second bit RA<N>which is scrambled with the first bit RA<0> may be any bit of the row address RA<1:R>. In one embodiment, the row decoder 1200 may decode a least significant bit SRA<0> of the scrambled row address SRA<0:R>, which is identical to the second bit RA<N>, and upper bits SRA<1:2>, and may generate the first decoding signals PXI<0:7>. The row decoder 1200 may decode a bit SRA<N> of the scrambled row address SRA<0:R>, which is identical to the first bit RA<0>, and an upper bit, and may generate the second decoding signals NWEIB<0:S>. The bit SRA<N> and the upper bit may not be used to generate the first decoding signals PXI<0:7>. Even though row addresses for selecting word lines which are adjacent to each other are input to the row decoder 1200, word lines corresponding to row addresses scrambled by the address scrambler 1210a may not be adjacent to each other. For example, as "N" of the second bit RA<N> increases, a difference between locations of selected word lines may increase. The row decoder 1200 may scramble the second decoding signals NWEIB<0:S> as well as a word line. The row decoder 1200 may decode a bit SRA<N> of the scrambled row address SRA<0:R>, which is identical to the first bit RA<0>, and an upper bit and may select mats MAT<0:T>. In this case, the row decoder 1200 may not only prevent word lines, which are adjacent to each other, from being accessed, but also the row decoder 1200 may prevent mats, which are adjacent to each other, from being accessed. The row decoder 1200 may scramble mats as well as a word line.

Figure 7:
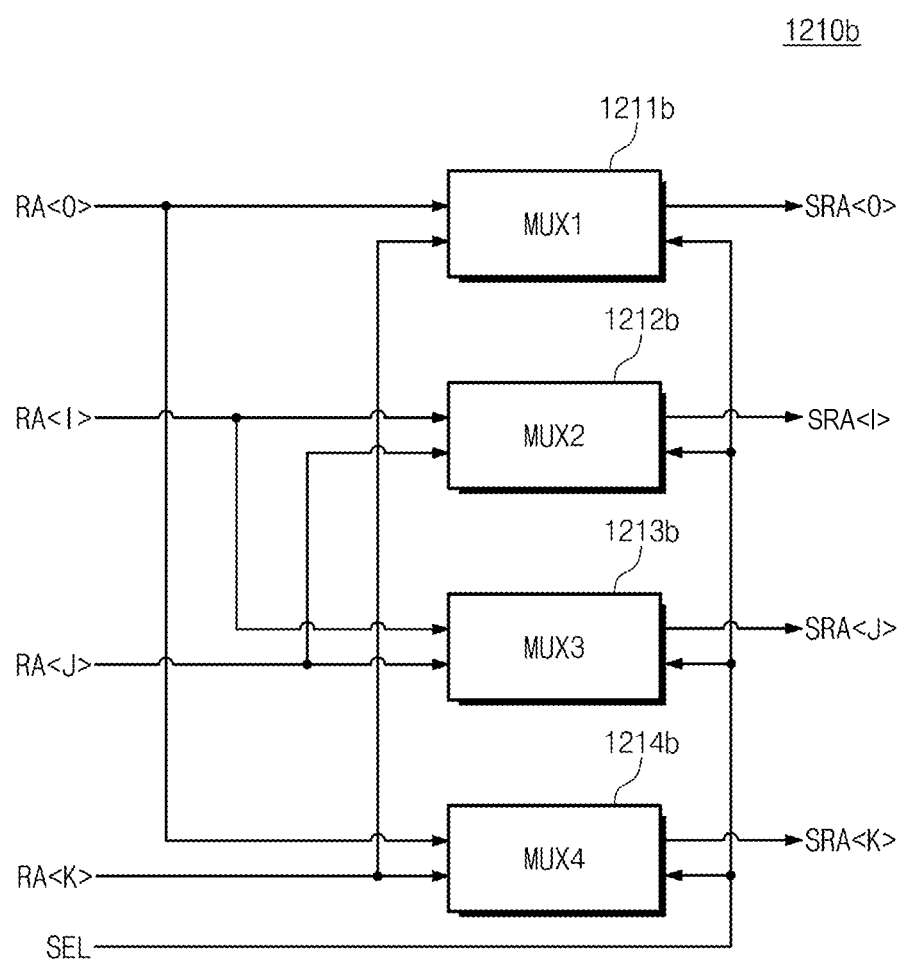
FIG. 7 is a block diagram illustrating another embodiment of an address scrambler of FIG. 5.

FIG. 7 is a block diagram illustrating another embodiment of an address scrambler of FIG. 5. FIG. 7 will be described with reference to FIGS. 1 to 6. An address scrambler 1210b may include a first multiplexer 1211b, a second multiplexer 1212b, a third multiplexer 1213b, and a fourth multiplexer 1214b.

The first multiplexer 1211b may output one of a first bit RA<0> and a fourth bit RA<K> of the row address RA<0:R>depending on the selection signal SEL. The second multiplexer 1212b may output one of a third bit RA<J> and a second bit RA<I> of the row address RA<0:R>depending on the selection signal SEL. The third multiplexer 1213b may output one of the second bit RA<I> and the third bit RA<J> of the row address RA<0:R>depending on the selection signal SEL. The fourth multiplexer 1214a may output one of the fourth bit RA<K>and the first bit RA<0> of the row address RA<0:R>depending on the selection signal SEL. In the case where the anti-fuse corresponding to the selection signal SEL is programmed (e.g., is in a first state), the first multiplexer 1211b may output the fourth bit RA<K>instead of the first bit RA<0>. The second multiplexer 1212b may output the third bit RA<J>instead of the second bit RA<I>. The third multiplexer 1213b may output the second bit RA<I>instead of the third bit RA<J>. The fourth multiplexer 1214b may output the first bit RA<0>instead of the fourth bit RA<K>. The scrambled row address SRA<0:R> may include bits SRA<0>, SRA<I>, SRA<J>, and SRA<K>output from the first to fourth multiplexers 1211b to 1214b, respectively.

In an embodiment, the fourth bit RA<K>which is scrambled with the first bit RA<0> may be any bit of the row address RA<1:R>. Also, each of the second and third bits RA<I>and RA<J> may be any bit of the row address RA<1:R>. Here, "I", "J", and "K" which are a natural number may be different from each other. In a case where the anti-fuse corresponding to the selection is not programmed (e.g., is in a second state), the scrambled row address SRA<0:R>may include the same ordered bits as the row address RA<0:R>, such that the first multiplexer 1211b outputs the first bit RA<0>, the second multiplexer 1212b outputs the second bit RA<I>, the third multiplexer 1213b outputs the third bit RA<J>, and the fourth multiplexer 1214b outputs the fourth bit RA<K>.

Figure 8:
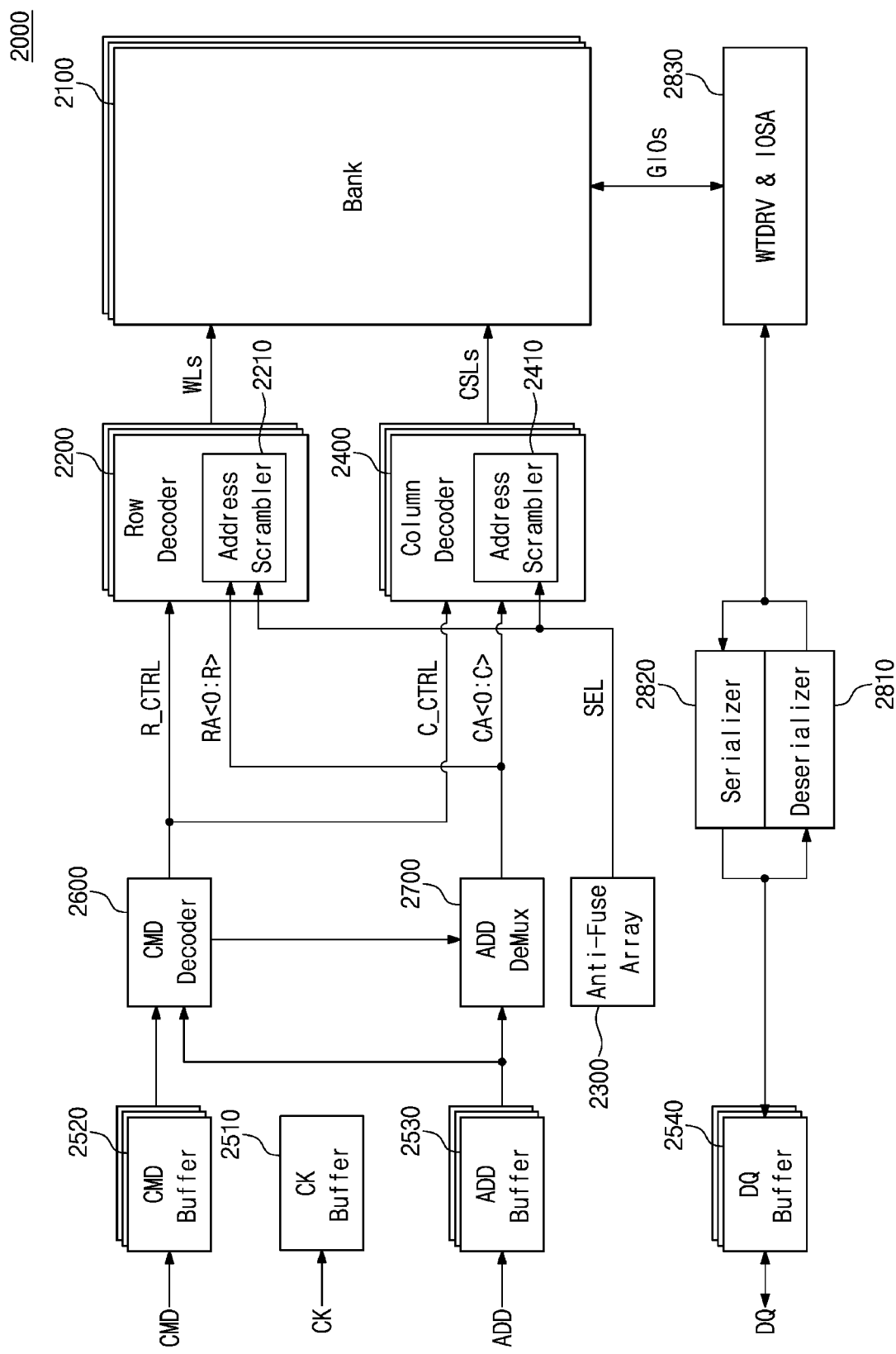
FIG. 8 is a block diagram illustrating a memory device according to another embodiment of the inventive concept.

FIG. 8 is a block diagram illustrating a memory device according to another embodiment of the inventive concept. A memory device 2000 may include a bank 2100, a row decoder 2200, an anti-fuse array 2300, a column decoder 2400, a clock buffer 2510, a command buffer 2520, an address buffer 2530, a data input/output buffer 2540, a command decoder 2600, an address demultiplexer 2700, a deserializer 2810, a serializer 2820, and a write driver and input/output sense amplifier 2830.

The bank 2100 may be identical to the memory cell array 1100 described with reference to FIGS. 1 to 3 and 5. The number of banks is not limited to the illustration of FIG. 8 and may be determined depending on a capacity of the memory device 2000, a protocol, etc. As the number of banks increases, the accessibility of the memory device 2000 may be improved.

The row decoder 2200 may be identical to the row decoder 1200 described with reference to FIGS. 1 and 5 to 7. The row decoder 2200 may receive a row control signal R_CTRL from the command decoder 2600 and may select word lines WLs based on the row control signal R_CTRL. When an activate command, a refresh command, etc. are input to the memory device 2000, the row decoder 2200 may select at least one of the word lines WLs. When a decharge command is input to the memory device 2000, the row decoder 2200 may decharge a selected word line(s). The row decoder 2200 may include an address scrambler 2210. The address scrambler 2210 may be identical to any one of the address scramblers 1210, 1210a, and 1210b described with reference to FIGS. 1 and 5 to 7. The anti-fuse array 2300 may be the anti-fuse array 1300 described with reference to FIG. 1.

The column decoder 2400 may decode a column address CA<0:C> and may select column selection lines CSLs. A range of the column address CA<0:C> and the number of the column selection lines CSLs may be determined based on a capacity of the memory device 2000, the number of data input/output signals, the number of banks 2100, a page size, etc. An example is illustrated in FIG. 8 as the column selection lines CSLs and the word lines WLs are parallel to each other, but the column selection lines CSLs may be arranged to be perpendicular to the word lines WLs.

As in the row decoder 2200, the column decoder 2400 may include an address scrambler 2410. An operation of the address scrambler 2410 may be similar to the operation of the address scrambler 2210 of the row decoder 2200 except for receiving the column address CA<0:C>. In an embodiment, referring to FIG. 8, the address scrambler 2410 may receive the selection signal SEL that the address scrambler 2210 of the row decoder 2200 receives. In another embodiment, the address scrambler 2410 may receive a selection signal different from the selection signal SEL that the address scrambler 2210 of the row decoder 2200 receives. In this case, the anti-fuse array 2300 may further include an anti-fuse to which a logical value of the different selection signal provided to the address scrambler 2410 is programmed. In the case where the anti-fuse corresponding to the different selection signal is programmed, the address scrambler 2410 may scramble the column address CA<0:C> and may generate a scrambled column address SCA<0:C>identical to or different from the column address CA<0:C>.

The clock buffer 2510 may operate as a receiver (RX) which receives a clock signal CK. The memory device 2000 may operate based on the clock signal CK as a synchronous dynamic random access memory (SDRAM). The clock buffer 2510 may provide the received clock signal CK to internal components of the memory device 2000.

The command buffer 2520 may operate as a receiver which receives command signals CMD (e.g., CS_n, ACT_n, RAS_n, CAS_n, and WE_n). The command buffer 2520 may sample the command signals CMD at a rising edge or a falling edge of the clock signal CK. The command buffer 2520 may provide the sampled command to the command decoder 2600. The number of command signals CMD and the number of command buffers 2520 may be defined in advance in compliance with the protocol of the memory device 2000.

The address buffer 2530 may operate as a receiver which receives address signals ADD (e.g., A0, A1, A2, etc.). The address buffer 2530 may sample the address signals ADD at a rising edge or a falling edge of the clock signal CK. The address buffer 2530 may provide the sampled address to the address demultiplexer 2700. The address buffer 2530 may provide signals, which correspond to the command, from among the sampled address signals to the command decoder 2600. The number of address signals ADD and the number of address buffers 2530 may be defined in advance in compliance with the protocol and capacity of the memory device 2000.

An example is illustrated in FIG. 8 as the command buffer 2520 and the address buffer 2530 are separated. Unlike illustration of FIG. 8, the memory device 2000 may receive command/address (CA) signals which may include both a command and an address, and may include CA buffers receiving CA signals. In any case, the memory device 2000 may receive a command and an address from the outside.

The data input/output buffer 2540 may operate as a receiver that receives data input/output signals DQ. The data input/output buffer 2540 may output write data by sampling the data input/output signals DQ at a rising edge or a falling edge of the data strobe signal DQS. The data input/output buffer 2540 may provide the write data to the deserializer 2810. The data input/output buffer 2540 may receive read data from the serializer 2820. The data input/output buffer 2540 may output the data input/output signals DQ including the read data in synchronization with a data strobe signal DQS. The number of data input/output signals DQ and data input/output buffers 2540 may be defined in advance in compliance with the protocol of the memory device 2000. As the number of data input/output signals DQ and data input/output buffers 2540 increases, the bandwidth of the memory device 2000 may increase. Although not illustrated in FIG. 8, the memory device 2000 may further include a data strobe buffer which receives or outputs the data strobe signal DQS.

The command decoder 2600 may receive and decode a command from the command buffer 2520 and the address buffer 2530. For example, the command decoder 2600 may receive an activate command, a write command, a read command, a decharge command, a refresh command, etc. The command decoder 2600 may decode an activate command and may provide a row control signal R_CTRL to the row decoder 2200. The command decoder 2600 may control the address demultiplexer 2700 such that the address demultiplexer 2700 transmits an address received together with the activate command to the row decoder 2200 as the row address RA<0:R>. The command decoder 2600 may decode a decharge command and may provide the row control signal R_CTRL to the row decoder 2200.

In an embodiment, the command decoder 2600 may receive a first activate command for activating first memory cells of the bank 2100, may receive a decharge command for decharging the first memory cells, and may receive a second activate command for activating second memory cells of the bank 2100. Here, a first word line connected to the first memory cells and a second word line connected to second memory cells may be adjacent to each other. The row decoder 2200 may activate the first word line corresponding to a first value (a decimal value) of the row address RA<0: R>received together with the first activate command and may decharge the first word line depending on the first decharge command. An operation of activating and decharging a word line refers to an operation of applying a high voltage to the word line and then applying a low voltage to the word line. Afterwards, the row decoder 2200 may activate a third word line corresponding to a third, scrambled, value of the row address RA<0:R>, instead of the second word line corresponding to a second value of the row address RA<0:R>, when the second value of the row address RA<0:R> is received together with the second activate command, by using the address scrambler 2210. Here, the third word line may not be adjacent to the first and second word lines and may be within the bank 2100.

For example, at least one word line and memory cells connected to the at least one word line may be interposed between the third word line and any one of the first and second word lines. For another example, the bit line sense amplifiers 1131 to 1139 described with reference to FIG. 2 may be interposed between the third word line and any one of the first and second word lines. In the case where a mat including the first and second word lines is adjacent to a mat including the third word line, bit line sense amplifiers interposed between the third word line and any one of the first and second word lines may sense data of memory cells connected to the first to third word lines. In contrast, in the case where a mat including the first and second word lines is not adjacent to a mat including the third word line, bit line sense amplifiers which may sense data of memory cells connected to the first and second word lines may not sense data of memory cells connected to the third word line.

The row decoder 2200 may scramble a first value of the row address RA<0:R>and a second value of the row address RA<0:R>. As described above, in the case where values of bits to be scrambled are identical to each other, even though a scramble operation is performed, a value of the row address RA<0:R> may not be changed. Thus, though a first value of the row address RA<0:R> and a second value of the row address RA<0:R> may be swapped, since the values are the same, the value of the row address RA<0:R>does not change. In the above exemplification, the first value of the row address RA<0:R> may not be changed by the scramble operation of the row decoder 2200. The second value of the row address RA<0:R> may be changed to the third value by the scramble operation of the row decoder 2200. Even though the first and second activate commands for activating adjacent word lines are input, the row decoder 2200 may activate word lines, which are not adjacent to each other, through the scramble operation.

The command decoder 2600 may decode a refresh command and may provide the row control signal R_CTRL to the row decoder 2200. The command decoder 2600 may decode the refresh command and may provide the row decoder 2200 with a refresh row address generated within the memory device 2000 depending on the refresh command. The memory device 2000 may include an address counter (not illustrated) which internally generates a refresh row address whenever the refresh command is received. The address scrambler 2210 of the row decoder 2200 may scramble both the row address RA<0:R>received from the outside and a refresh row address. Since a refresh operation refers to an operation in which all word lines of the memory device 2000 are selected at least once or more within a refresh period (e.g., tREFI) determined in advance, the row decoder 2200 may process the activate command and the refresh command similarly. The row decoder 2200 may scramble an input row address regardless of the activate command or the refresh command.

In an embodiment, the command decoder 2600 may receive a first refresh command and a second refresh command for refreshing the bank 2100. The second refresh command may be input after the first refresh command is input and a refresh cycle time tRFC elapses. The row decoder 2200 may scramble a first refresh row address generated based on the first refresh command and may activate and decharge a first word line corresponding to the scrambled row address. The row decoder 2200 may scramble a second refresh row address generated based on the second refresh command and may activate and decharge a third word line corresponding to the scrambled row address instead of a second word line adjacent to the first word line. The row decoder 2200 may select word lines, which are not adjacent to each other, depending on refresh commands.

The command decoder 2600 may decode a read command or a write command and may provide a column control signal C CTRL to the column decoder 2400. The command decoder 2600 may control the address demultiplexer 2700 such that the address demultiplexer 2700 transmits an address received together with the read command or the write command to the column decoder 2400 as the column address CA<0:C>.

The address demultiplexer 2700 may receive an address through the address buffer 2530. Under control of the command decoder 2600, the address demultiplexer 2700 may provide a received address to the row decoder 2200 as the row address RA<0:R> or may provide a received address to the column decoder 2400 as the column address CA<0:C>.

In an embodiment, unlike the illustration of FIG. 8, the address demultiplexer 2700, which is outside of the row decoder 2200 and column decoder 2400, may include the address scrambler 2210 of the row decoder 2200 and the address scrambler 2410 of the column decoder 2400. Thus, the row decoder 2200 may not include the address scrambler 2210, and the column decoder 2400 may not include the address scrambler 2410. The address demultiplexer 2700 may provide the scrambled row address SRA<0:R> to the row decoder 2200. The address demultiplexer 2700 may provide the scrambled column address SCA<0:C> to the column decoder 2400.

In an embodiment, the command decoder 2600 may further decode a mode register set (MRS) command for setting a logical value of the selection signal SEL. The address buffer 2530 may further receive an operation code transmitted by using address signals ADD together with the MRS command, and the operation code may be provided to the address demultiplexer 2700. Although not illustrated in FIG. 8, the memory device 2000 may further include a mode register. The mode register may store the operation code transmitted together with the MRS command for setting a logical value of the selection signal SEL. Instead of the anti-fuse array 2300, the mode register may provide the selection signal SEL to the address scramblers 2210 and 2410.

The deserializer 2810 may deserialize bits of write data included in the data input/output signals DQ provided through the data input/output buffer 2540. The deserializer 2810 may provide the write data including the deserialized bits to the write driver and input/output sense amplifier 2830. The serializer 2820 may serialize bits of read data output from the write driver and input/output sense amplifier 2830. The serializer 2820 may provide the read data including the serialized bits to the data input/output buffer 2540.

The write driver and input/output sense amplifier 2830 may write the write data to memory cells selected by the row decoder 2200 and the column decoder 2400 through global input/output lines GIOs. The write driver and input/output sense amplifier 2830 may read the read data from the selected memory cells through the global input/output lines GIOs.

Figure 9:
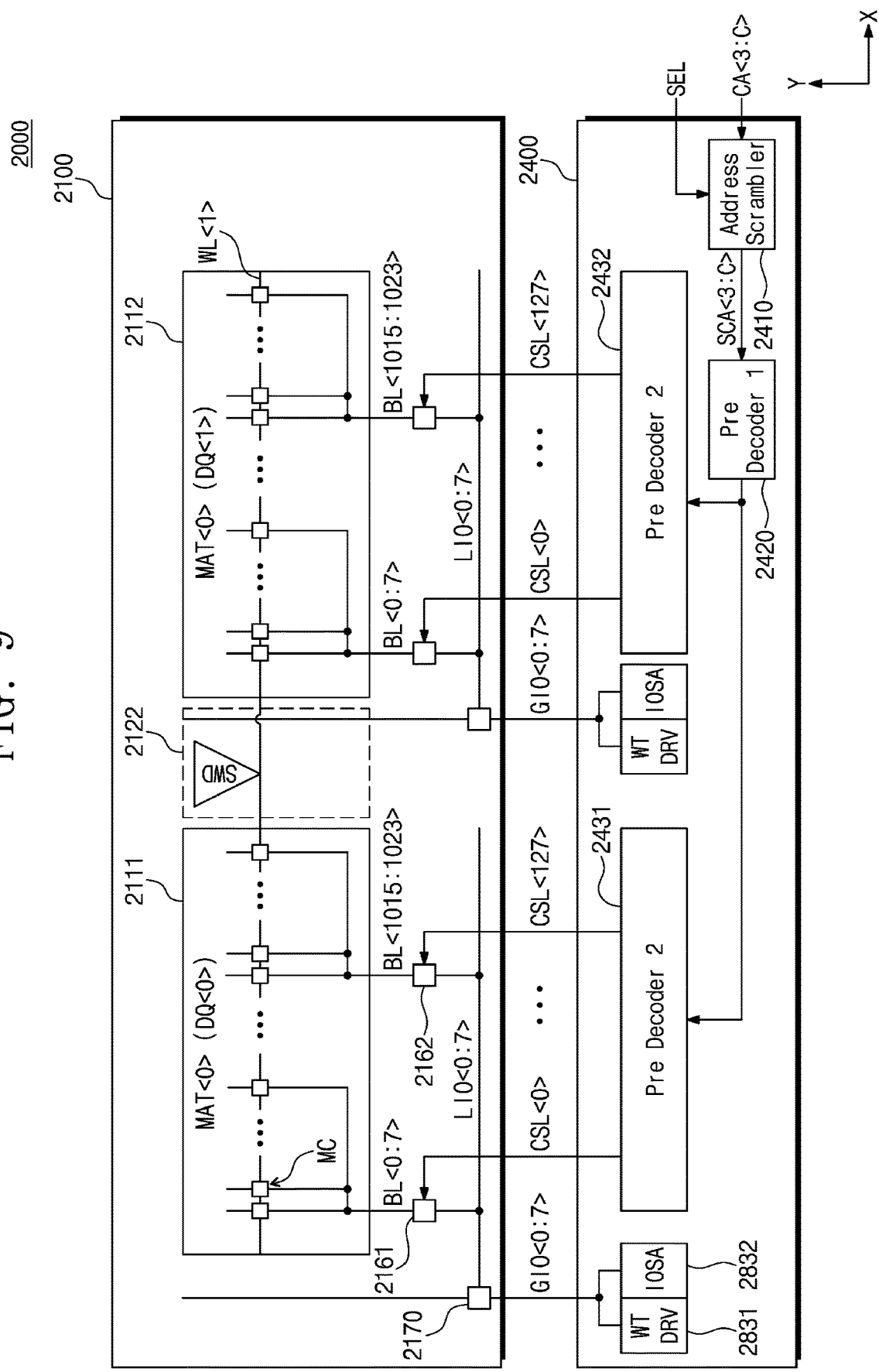
FIG. 9 is a block diagram illustrating a bank of FIG. 8, according to some embodiments.

FIG. 9 is a block diagram illustrating a bank of FIG. 8. FIG. 9 will be described with reference to FIGS. 2, 3, and 8. The bank 2100 may be the memory cell array 1100 of FIG. 2. Mats 2111 and 2112 may be the sub memory cell arrays 1111 and 1112 of FIG. 2. For convenience of illustration, only one word line WL<1> of word lines in the mats 2111 and 2112 is illustrated. Sub word line drivers 2122 may be the sub word line driver 1122 of FIGS. 2 and 3. Each of the mats 2111 and 2112 may include memory cells MC which are connected to the word line WL<1> and are arranged in the X-axis direction. For example, the memory cells MC may be respectively connected to bit lines BL<0:1023>.

Column selection transistors 2161 may connect the bit lines BL<0:7> and local input/output lines LIO<0:7> depending on a column selection signal transmitted through the column selection line CSL<0>. Column selection transistors 2162 may connect the bit lines BL<1015:1023> and the local input/output lines LIO<0:7> depending on a column selection signal transmitted through the column selection line CSL<127>. The column selection line CSL<0:127> may be arranged in order depending on a change of the column address CA<3:C>. The bank 2100 may further include column selection transistors connecting the bit lines BL<8:1014> and the local input/output lines LIO<0:7>, and column select lines CSL<1:126> connected to the column selection transistors. The local input/output lines LIO<0:7> may be arranged parallel to the word line WL<1> and a length of the local input/output lines LIO<0:7> may correspond to an X-axis length of one mat.

Switches 2170 may connect the local input/output lines LIO<0:7> and global input/output lines GIO<0:7>. The switches 2170 may include transistors connecting the local input/output lines LIO<0:7> and the global input/output lines GIO<0:7> in a write operation or a read operation, and local sense amplifiers sensing and amplifying data output to the local input/output lines LIO<0:7> in the read operation. The global input/output lines GIO<0:7> may be arranged to be perpendicular to the local input/output lines LIO<0:7>. A length of the global input/output lines GIO<0:7> may correspond to a Y-axis length of the bank 2100.

A write driver 2831 may store bits included in a data input/output signal DQ<0> to the mat 2111. The write driver 2831 may store the bits included in the data input/output signal DQ<0> to memory cells through the global input/output lines GIO<0:7>, the switches 2170, the local input/output lines LIO<0:7>, column selection transistors connected to a column selection line, which corresponds to the column address CA<3:C>, from among the column selection lines CSL<0:127>, and bit lines connected to the column selection transistors. An input/output sense amplifier 2832 may sense bits stored in memory cells of the mat 2111 through bit lines selected according to the column address CA<3:C>, the column selection transistors, the local input/output lines LIO<0:7>, the switches 2170, and the global input/output lines GIO<0:7>. Bits stored in memory cells of the mat 2111 may be included in the data input/output signal DQ<0> and may be output to the outside of the memory device 2000. The write driver 2831 and the input/output sense amplifier 2832 may be included in the write driver and input/output sense amplifier 2830 of FIG. 8, or may be positioned in the column decoder 2400 as illustrated in FIG. 9.

Data input/output associated with the mat 2112 may be similar to data input/output associated with the mat 2111. Bits included in a data input/output signal DQ<1> may be stored to the mat 2112 in the above-described manner. Bits stored in memory cells of the mat 2112 may be included in not the data input/output signal DQ<0> but the data input/output signal DQ<1> and may be output to the outside of the memory device 2000.

In an embodiment, with regard to the mat 2111 connected to the word line WL<1>, the number of memory cells and the number of bit lines BL<0:1023> are not limited to the illustration of FIG. 9, and may be determined based on the column address CA<0:C> which complies with the protocol of the memory device 2000. The number of the column selection transistors 2161 and 2162, the number of the local input/output lines LIO<0:7>, the number of the switches 2170, and the number of the global input/output lines GIO<0:7> are not limited to the illustration of FIG. 9, and may be identical to the number of memory cells to be selected by the column decoder 2400 based on a write command or a read command. For example, the number of memory cells to be selected by the column decoder 2400 based on the write command or the read command may be determined based on a prefetch size, a burst length BL, etc. of the memory device 2000.

In an embodiment, lower bits CA<0:2> of the column address CA<0:C> may indicate a burst sequence in which bits (data) stored in memory cells are output. The burst length of the memory device 2000 may be determined in compliance with the protocol, and the number of bits indicating the burst sequence may vary with the burst length. The remaining column address CA<3:C>other than the bits CA<0:2>indicating the burst sequence may indicate one of the column selection lines CSL<0:127>. The number of the column selection line CSL<0:127> may be determined depending on a range of the column address CA<3:C>. The range of the column address CA<3:C> may be determined based on a capacity, a page size, the number of data input/output lines, etc. associated with the memory device 2000.

The column decoder 2400 may include the address scrambler 2410, a first pre-decoder 2420, and second pre-decoders 2431 and 2432. An operation and implementation of the address scrambler 2410 may be similar to the operation and implementation of the address scrambler 1210 described with reference to FIG. 1 or 5 or the address scrambler 1210a or 1210b described with reference to FIG. 6 or 7, except that the column address CA<3:C> is received. The address scrambler 2410 may scramble a first bit CA<3> and a second bit CA<N> of the column address CA<3:C>depending on the selection signal SEL and may generate a scrambled column address SCA<3:C>. The address scrambler 2410 may not scramble the lower bits CA<0:2> of the column address CA<0:C>. The first bit CA<3> may be a least significant bit of the scrambled column address SCA<3:C>used to decode or select the column selection line CSL<0:127>; in the second bit CA<N>, "N" is an any natural number which is greater than 3 and not greater than "C".

The first pre-decoder 2420 may decode the scrambled column address SCA<3:C>. Each of the second pre-decoders 2431 and 2432 may select one of the column selection line CSL<0:127>based on a decoding result of the first pre-decoder 2420. For example, when the scrambled column address SCA<3:C> is "00 . . . 00b", each of the second pre-decoders 2431 and 2432 may transmit a column selection signal to column selection transistors through the column selection line CSL<0>. The number of the second pre-decoders 2431 and 2432 may be identical to the number of mats arranged along the X-axis in the bank 2100, and the second pre-decoders 2431 and 2432 may select the column selection line CSL<0:127> at the same time.

When bit lines which are adjacent to each other are frequently selected, disturbance, coupling, etc. may occur in memory cells connected to the bit lines. As in the row decoders 1200 and 2200, the column decoder 2400 may scramble a column address, thereby making it possible to prevent bit lines which are adjacent to each other from being frequently selected. In the bit lines BL<0:1023>, the bit lines BL<0:7> may be adjacent to the bit lines BL<8:15>. For example, a difference between a value of a column address CA<3:C>(=00 . . . 00b) corresponding to the column selection line CSL<0>for selecting the bit lines BL<0:7> and a value of a column address CA<3:C>(=00 . . . 01b) corresponding to the column selection line CSL<1>for selecting the bit lines BL<8:15> may be a value corresponding to a least significant bit CA<3> of the column address CA<3:C>. A difference between values of the column address CA<3:C>respectively corresponding to column selection lines connected to bit lines which are adjacent to each other may be a value corresponding to the least significant bit CA<3> of the column address CA<3:C>. The column decoder 2400 may scramble a first bit CA<3> and a second bit CA<N> of the column address CA<3:C>.

Figure 10:
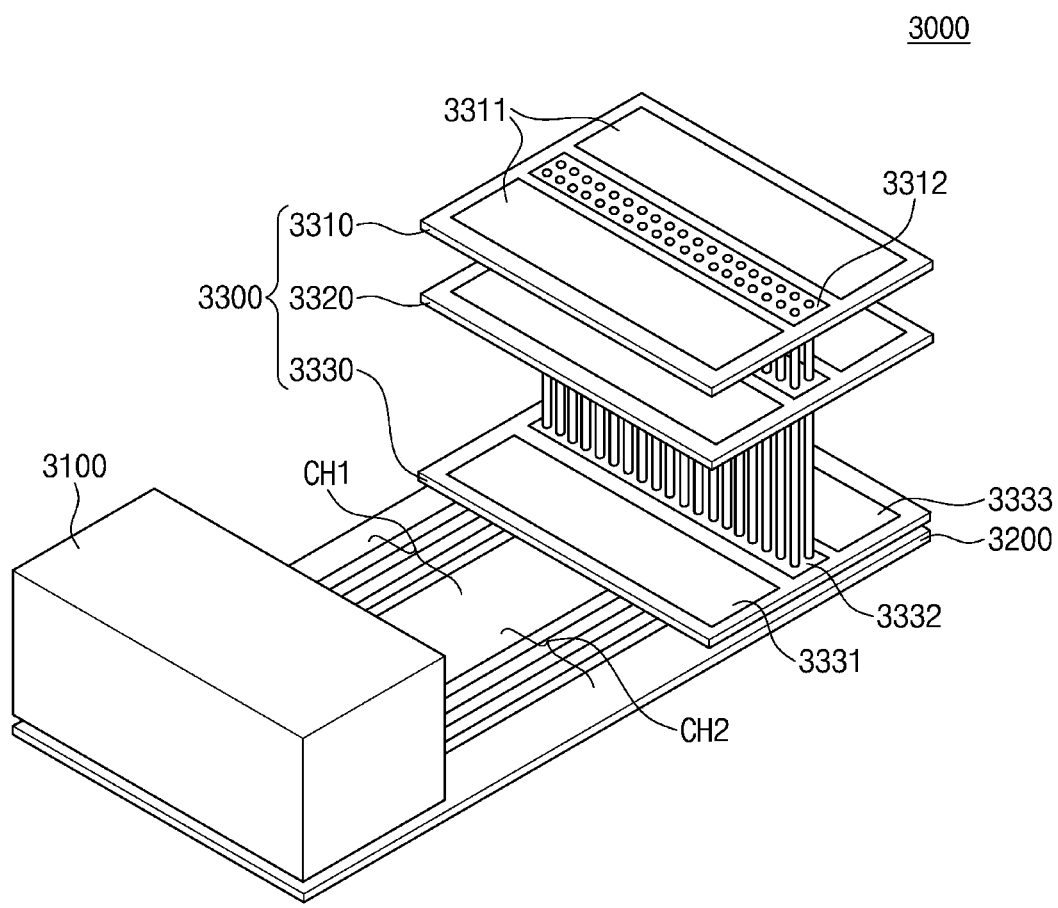
FIG. 10 is a block diagram illustrating a storage system to which a memory device of the disclosed embodiments is applied.

FIG. 10 is a block diagram illustrating a storage system to which a memory device of the inventive concept is applied. A storage system 3000 may include a system on chip (SoC) 3100, an interposer 3200, and a memory device 3300.

The SoC 3100 may include a processor, a memory controller, etc. and may communicate with the memory device 3300 through a plurality of channels CH1 and CH2. The SoC 3100 may be positioned on one surface of the interposer 3200, and solder balls or bumps may be positioned on one surface of the SoC 3100. The SoC 3100 may be electrically connected with the interposer 3200. The interposer 3200 may provide an input/output path between the SoC 3100 and the memory device 3300. For example, the interposer 3200 may be manufactured by using a silicon wafer. A plurality of wirings included in the plurality of channels CH1 and CH2 connecting the SoC 3100 and the memory device 3300 may be formed on the interposer 3200. The number of the channels CH1 and CH2 is not limited to illustration of FIG. 10.

The memory device 3300 may include first and second memory dies 3310 and 3320 and a buffer die 3330. The memory device 3300 may be a high bandwidth memory (HBM) device in which the first and second memory dies 3310 and 3320 are vertically stacked on the buffer die 3330. The number of memory dies included in the memory device 3300 is not limited to illustration of FIG. 10. The memory device 3300 may support the independent channels CH1 and CH2, and the SoC 3100 may independently access banks respectively assigned to the channels CH1 and CH4.

The first memory die 3310 may include a circuit region 3311 and a through-silicon via region 3312. Components of the memory device 2000 described with reference to FIG. 8 may be placed in the circuit region 3311. Through-silicon vias electrically connected to any other memory die and the buffer die 3330 may be placed in the through-silicon via region 3312. The first memory die 3310 may receive a command, an address, data, etc. through the through-silicon vias placed in the through-silicon via region 3312 from the buffer die 3330, and may output data to the buffer die 3330 through the through-silicon vias placed in the through-silicon via region 3312. The second memory die 3320 may be implemented to be identical to the first memory die 3310.

The buffer die 3330 may include a channel region 3331, a through-silicon via region 3332, and a direct access (DA) region. Circuits and bumps for inputting/outputting a command, an address, data, etc. of the channels CH1 and CH2 may be placed in the channel region 3331. Through-silicon vias for transmitting or receiving a command, an address, data, etc. of the channels CH1 and CH2 to or from the first and second memory dies 3310 and 3320 may be placed in the through-silicon via region 3332. Circuits or bumps for directly accessing the first and second memory dies 3310 and 3320 may be placed in the DA region.

Figure 11:
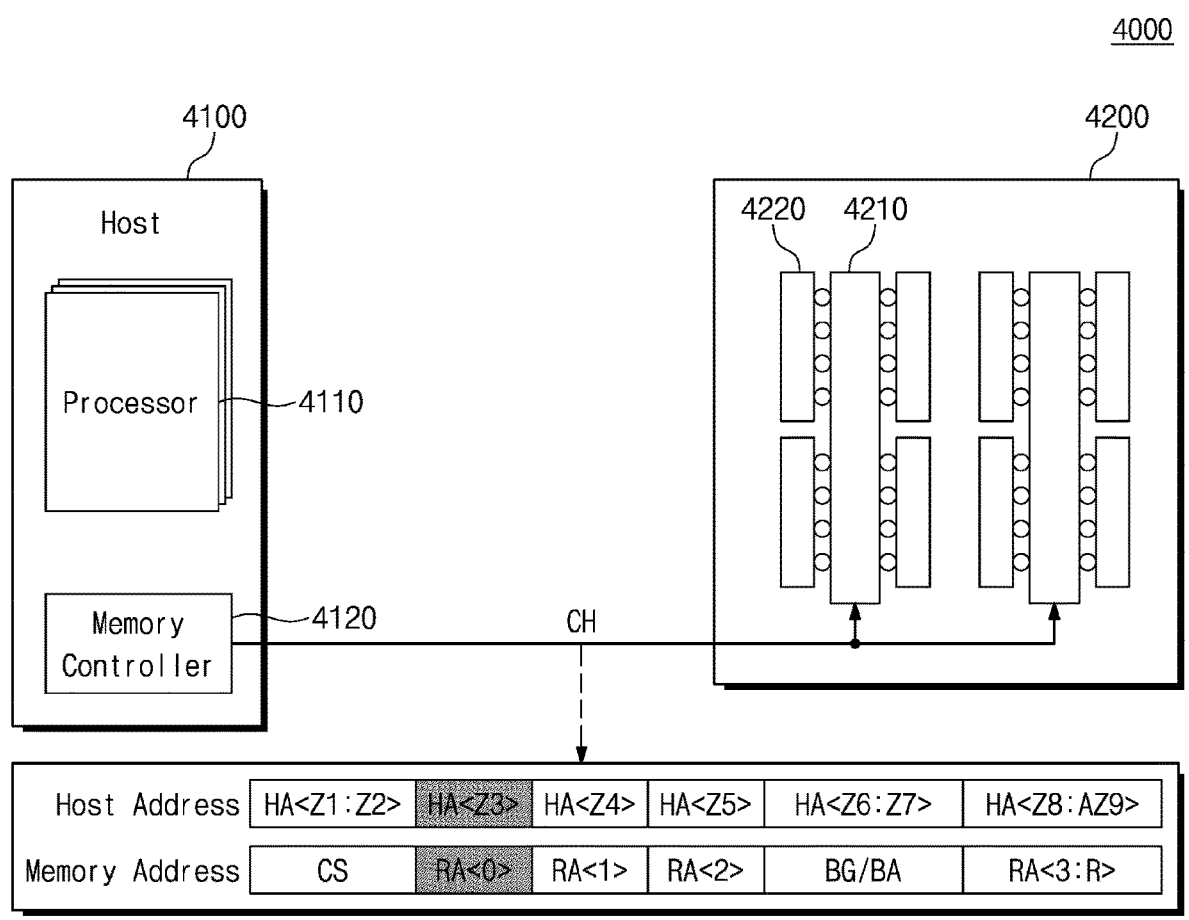
FIG. 11 is a block diagram illustrating a storage system to which a memory device of the disclosed embodiments is applied.

FIG. 11 is a block diagram illustrating a storage system to which a memory device of the inventive concept is applied.

A storage system 4000 may include a host 4100 and a memory module 4200. The host 4100 may include a processor 4110 and a memory controller 4120. The processor 4110 may execute various applications which the host 4100 supports; the processor 4110 may store data to the memory module 4200 or may request data from the memory module 4200. The memory controller 4120 may communicate with the memory module 4200 through a channel CH under control of the processor 4110. For example, the memory controller 4120 may transmit an activate command, a write command, a read command, a precharge command, a refresh command, write data, etc. to the memory module 4200 through the channel CH. The memory controller 4120 may receive read data associated with the read command through the channel CH.

The memory module 4200 may be a dual in-line memory module (DIMM), and may include memory devices 4220 attached on opposite surfaces of a substrate 4210. Each of the memory devices 4220 may be the memory device 2000 described with reference to FIG. 8. An example is illustrated as the memory module 4200 has a DIMM per channel (2 DPC) structure, but the number of DIMMs per channel is not limited thereto. The memory controller 4120 may communicate with the memory module 4200 through one channel CH. Referring to FIG. 11, mapping between a host address HA<Z1:Z9> generated by the memory controller 4120 and a memory address is illustrated. Each of Z1 to Z9 of the host address HA<Z1:Z9> may be any natural number. For example, the host address HA<Z1:Z2> may correspond to channel selection signals CS. The host address HA<Z3:Z5> may correspond to a row address RA<0:2>. The host address HA<Z6:Z7> may correspond to bank group selection signal (BG)/bank selection signal (BA). The host address HA<Z8:Z9> may correspond to a row address RA<3:R>.

The memory controller 4120 may randomly access all memory cells in the memory module 4200 while changing the host address HA<Z1:Z9>. However, the memory controller 4120 may frequently change only the host address HA<Z3> corresponding to the row address RA<0>. Due to the above-described access scheme, adjacent word lines in the memory module 4200 may be selected frequently. Accordingly, a memory device according to an embodiment of the inventive concept may scramble an address, thus preventing adjacent word lines from being accessed frequently.

A memory device according to an embodiment of the inventive concept may scramble an address, thus preventing adjacent word lines from being accessed frequently. The memory device according to another embodiment of the inventive concept may scramble an address, thus preventing adjacent column selection lines from being accessed frequently.

While the inventive concept has been described with reference to exemplary embodiments thereof, it will be apparent to those of ordinary skill in the art that various changes and modifications may be made thereto without departing from the spirit and scope of the invention as set forth in the following claims.

What is claimed is:

1. A memory device comprising:
a memory cell array including memory cells connected to word lines which are arranged in order depending on a change of a row address;
a row decoder configured to scramble a first bit of the row address and a second bit of the row address depending on a selection signal, thereby forming a scrambled row address, to decode the scrambled row address, and to select the word lines; and
an anti-fuse array including an anti-fuse in which a logical value of the selection signal is stored,
wherein a first word line and a second word line of the word lines are adjacent to each other, and
wherein a difference between a first value of the row address corresponding to the first word line and a second value of the row address corresponding to the second word line is a value corresponding to the first bit.

2. The memory device of claim 1, wherein:
the first bit is a least significant bit of each row address, and
the second bit is an upper bit other than the least significant bit of each row address.

3. The memory device of claim 1, wherein the row decoder includes:
a first multiplexer configured to output the second bit instead of the first bit depending on the selection signal; and
a second multiplexer configured to output the first bit instead of the second bit depending on the selection signal,
wherein the scrambled row address includes the second and first bits respectively output from the first and second multiplexers.

4. The memory device of claim 3, wherein the memory cell array includes a sub word line driver driving each of the word lines,
wherein the row decoder is configured to provide a first decoding signal to a power terminal of the sub word line driver and to provide a second decoding signal to an input terminal of the sub word line driver, and
wherein the row decoder is configured to generate the first decoding signal by decoding a first bit of the scrambled row address, which is identical to the second bit of the row address, and an upper bit of the scrambled row address following the first bit of the scrambled row address.

5. The memory device of claim 4, wherein the row decoder is configured to generate the second decoding signal by decoding a second bit of the scrambled row address, which is identical to the first bit of the row address, and an upper bit of the scrambled row address following the second bit of the scrambled row address, and
wherein the second bit of the scrambled row address is not used to generate the first decoding signal.

6. The memory device of claim 3, wherein the memory cell array further includes bit line sense amplifiers connected to bit lines connected to the memory cells,
wherein the memory cells are divided into mats with respect to regions in which the bit line sense amplifiers are placed, and
wherein the row decoder is configured to select the mats by decoding a first bit of the scrambled row address, which is identical to the first bit of the row address, and an upper bit of the scrambled row address following the first bit of the scrambled row address.

7. The memory device of claim 3, wherein the row decoder further includes:
a third multiplexer configured to output a fourth bit of the row address instead of a third bit of the row address depending on the selection signal; and a fourth multiplexer configured to output the third bit instead of the fourth bit depending on the selection signal, wherein the scrambled row address includes the second, first, fourth, and third bits respectively output from the first, second, third, and fourth multiplexers.

8. The memory device of claim 1, further comprising:
a command decoder configured to receive a command and an address from an outside of the memory device and to transmit the address to the row decoder as the row address depending on the command.

9. The memory device of claim 1, configured such that after the memory device is packaged and is mounted on a module, the logical value of the selection signal can be used to program the anti-fuse.

10. The memory device of claim 1, wherein each of the memory cells includes one transistor connected to each of the word lines and one capacitor connected to the transistor.

11. A memory device comprising:
a memory cell array including memory cells connected to word lines which are arranged in sequential order depending on a sequential change of a row address;
a row decoder configured to scramble a particular-positioned bit of the row address and another-positioned bit of the row address based on a selection signal, thereby forming a scrambled row address, to decode the scrambled row address, and to select the word lines; and
an anti-fuse array including an anti-fuse in which a logical value of the selection signal is stored,
wherein a first word line corresponding to a first value of the row address and a second word line corresponding to a first value of the scrambled row address are not adjacent to each other,
wherein the first word line corresponding to the first value of the row address and a third word line corresponding to a second value of the row address are adjacent to each other, and
wherein a difference between the first value of the row address and the second value of the row address is a decimal value of 1.

12. The memory device of claim 11, wherein:
the row decoder includes multiplexers configured to receive the selection signal and an address including the particular-positioned bit and the another-positioned bit as inputs, and to output an address having the particular-positioned bit and the another-positioned bit swapped when the selection signal has a particular state.

13. The memory device of claim 11, wherein:
the particular-positioned bit is a least significant bit; and
the another-positioned bit is a different-positioned bit other than the least significant bit.

14. A memory device comprising:
a memory cell array including first memory cells connected to a first word line, second memory cells connected to a second word line adjacent to the first word line, and third memory cells connected to a third word line not adjacent to the first and second word lines;
a command decoder configured to receive a first activate command for activating the first memory cells, to receive a first deactivate command for deactivating the first memory cells, and to receive a second activate command for activating the second memory cells; and
a row decoder configured to activate the first word line corresponding to a first value of a row address received together with the first activate command, to deactivate the first word line depending on the first deactivate command, and to activate the third word line corresponding to a third, scrambled, value of the row address, instead of the second word line corresponding to a second value of the row address, when the second value of the row address is received together with the second activate command.

15. The memory device of claim 14, wherein the row decoder is configured to scramble the first value of the row address received together with the first activate command and to scramble the second value of the row address received together with the second activate command, depending on a selection signal, and
wherein the first value of the row address received together with the first activate command is not changed by a scramble operation of the row decoder, and the second value of the row address received together with the second activate command is changed to the third value by the scramble operation of the row decoder.

16. The memory device of claim 15, further comprising:
an anti-fuse array including an anti-fuse in which a logical value of the selection signal is stored.

17. The memory device of claim 14, wherein the memory cell array further includes:
fourth memory cells connected to at least one fourth word line interposed between the third word line and any one of the first and second word lines.

18. The memory device of claim 14, wherein the memory cell array further includes:
bit line sense amplifiers interposed between the third word line and any one of the first and second word lines and configured to sense data stored in the first and second memory cells through bit lines.

19. The memory device of claim 18, wherein the bit line sense amplifiers do not sense data stored in the third memory cells.

20. The memory device of claim 14, wherein the command decoder further receives a first refresh command and a second refresh command for refreshing the memory cell array, and
wherein the row decoder activates and deactivates the first word line depending on the first refresh command and activates and deactivates the third word line depending on the second refresh command.

* * * * *